(12) United States Patent
Shiono et al.

(10) Patent No.: US 9,365,920 B2
(45) Date of Patent: Jun. 14, 2016

(54) METHOD FOR DEPOSITING FILM

(75) Inventors: Ichiro Shiono, Yokohama (JP); Ekishu Nagae, Yokohama (JP); Yousong Jiang, Yokohama (JP); Takuya Sugawara, Yokohama (JP)

(73) Assignee: SHINCRON CO., LTD. (JP)

( * ) Notice: Subject to any disclaimer, the term of this patent is extended or adjusted under 35 U.S.C. 154(b) by 44 days.

(21) Appl. No.: 13/061,624

(22) PCT Filed: Aug. 24, 2009

(86) PCT No.: PCT/JP2009/064731
§ 371 (c)(1),
(2), (4) Date: Mar. 1, 2011

(87) PCT Pub. No.: WO2010/041524
PCT Pub. Date: Apr. 15, 2010

(65) Prior Publication Data
US 2011/0151138 A1    Jun. 23, 2011

(30) Foreign Application Priority Data

Sep. 10, 2008 (JP) .................................. 2008-263193

(51) Int. Cl.
*B05D 3/00* (2006.01)
*B05D 3/06* (2006.01)
*C23C 14/02* (2006.01)
(Continued)

(52) U.S. Cl.
CPC ............... *C23C 14/022* (2013.01); *C03C 17/42* (2013.01); *C03C 19/00* (2013.01); *C23C 14/0078* (2013.01); *C23C 14/3464* (2013.01); *C23C 14/505* (2013.01); *C23C 14/568* (2013.01); *H01J 37/321* (2013.01); *H01J 37/32422* (2013.01); *H01J 37/32513* (2013.01); *H01J 37/32633* (2013.01); *H01J 37/32761* (2013.01); *H01J 37/34* (2013.01); *C03C 2217/77* (2013.01)

(58) Field of Classification Search
CPC .. C03C 17/34; C03C 17/245; C03C 17/3429; C03C 17/3452; C03C 23/004; C23C 14/022; C23C 14/024
USPC ......... 427/162, 164, 529, 551, 553, 586, 596, 427/535, 554, 555, 552
See application file for complete search history.

(56) References Cited

U.S. PATENT DOCUMENTS 5,393,572 A * 2/1995 Dearnaley .................... 427/523
5,429,843 A    7/1995 Masaki et al.
(Continued)

FOREIGN PATENT DOCUMENTS

JP    05-239243    9/1993
JP    08-337874    12/1996
(Continued)

*Primary Examiner* — Michael Wieczorek
(74) *Attorney, Agent, or Firm* — Bacon & Thomas, PLLC

(57) ABSTRACT

The method for depositing a film of the present invention comprises the first irradiation step of irradiating particles having energy on a surface of a substrate 101, the first film deposition step of depositing a first film 103 on the surface of the substrate 101 subjected to the first irradiation step by using a dry process, and the second film deposition step of depositing a second film 105 having oil repellency on a surface of the first film 103. According to the present invention, a method for depositing a film enabling production of an oil-repellent substrate comprising an oil-repellent film having abrasion resistance of a practically sufficient level can be provided.

20 Claims, 10 Drawing Sheets

(51) Int. Cl.

| | | |
|---|---|---|
| *C03C 17/42* | (2006.01) | |
| *C03C 19/00* | (2006.01) | |
| *C23C 14/34* | (2006.01) | |
| *C23C 14/56* | (2006.01) | |
| *C23C 14/00* | (2006.01) | |
| *C23C 14/50* | (2006.01) | |
| *H01J 37/34* | (2006.01) | |
| *H01J 37/32* | (2006.01) | |

(56) References Cited

U.S. PATENT DOCUMENTS

| | | | |
|---|---|---|---|
| 5,846,649 A * | 12/1998 | Knapp et al. | 428/334 |
| 6,103,321 A * | 8/2000 | Fujinami et al. | 427/553 |
| 6,119,626 A | 9/2000 | Miyazawa et al. | |
| 6,145,984 A * | 11/2000 | Farwig | 351/49 |
| 6,284,377 B1 * | 9/2001 | Veerasamy | 428/408 |
| 6,645,301 B2 * | 11/2003 | Sainty | 118/665 |
| 6,787,441 B1 * | 9/2004 | Koh et al. | 438/608 |
| 6,991,826 B2 * | 1/2006 | Pellerite et al. | 427/164 |
| 2005/0073507 A1 * | 4/2005 | Richter et al. | 345/174 |
| 2005/0115923 A1 * | 6/2005 | Lacan et al. | 216/26 |
| 2006/0023311 A1 * | 2/2006 | Scherer et al. | 359/603 |
| 2007/0104891 A1 * | 5/2007 | Fournand | 427/561 |
| 2009/0323189 A1 * | 12/2009 | Taniguchi | 359/599 |

FOREIGN PATENT DOCUMENTS

| | | |
|---|---|---|
| JP | 09-309745 | 12/1997 |
| JP | 2007-155802 | 6/2007 |
| WO | WO 2008018570 A1 * | 2/2008 |

* cited by examiner

METHOD FOR DEPOSITING FILM

TECHNICAL FIELD

The present invention relates to a method for depositing a film.

BACKGROUND ART

There is known a method for depositing a film comprising forming scratches having a depth of 10 to 400 nm on a surface of a substrate consisting of glass, plastics, or the like so that the surface has fine streaky convexes and concaves in a predetermined direction, and then coating an oil-repellent film having a predetermined composition on the surface having the fine convexes and concaves to produce an oil-repellent article (Patent document 1).

PRIOR ART REFERENCE

Patent Document

Patent document 1: Japanese Patent Unexamined Publication (KOKAI) No. 9-309745

SUMMARY OF THE INVENTION

Object to be Achieved by the Invention

When oil components, such as fingerprint components, adhere to an oil-repellent film surface of an oil-repellent article of this type, the oil components are wiped off with wiping cloth or the like.

In an oil-repellent article formed by the method of Patent document 1, streaky scratches are formed in a predetermined direction with a predetermined depth on the surface of the substrate. Therefore, it has a problem that when wiping cloth or the like is slid on the surface in a direction crossing the scratches to wipe off the oil components, the oil-repellent film coated as the outermost surface layer is easily shaved off, and oil repellency of the oil-repellent film is eliminated by such wear.

In particular, the traverse friction test of the oil-repellent article formed by the method of Patent document 1 was performed with canvas cloth under a condition that a small load of 0.1 kg/cm$^2$ was applied (refer to the paragraph [0038] of Patent document 1), and it cannot be said that the oil-repellent film has practically sufficient abrasion resistance only with such a test.

An object of the present invention is to provide an oil-repellent substrate having an oil-repellent film showing practically sufficient abrasion resistance, and a method for depositing a film, which enables production of such an oil-repellent substrate.

Means for Achieving the Object

The present invention achieves the aforementioned object with the means for achieving the object described below. The means for achieving the object described below is explained with numerical notations corresponding to those used in the drawings showing embodiments of the present invention. However, these notations are used only for making it easier to understand the present invention, and are not intended to limit the scope of the present invention.

The method for depositing a film of the present invention comprises the first irradiation step of irradiating particles having energy on a surface of a substrate (101), the first film deposition step of depositing a first film (103) on the surface of the substrate (101) subjected to the first irradiation step by using a dry process, and the second film deposition step of depositing a second film (105) having oil repellency on a surface of the first film (103).

In the aforementioned invention, particles having energy of accelerating voltage at 100 to 2000 V can be used in the first irradiation step.

In the aforementioned invention, particles having energy of current density at 1 to 120 µA/cm$^2$ can be used in the first irradiation step.

In the aforementioned invention, the particles can be irradiated for 60 to 1200 seconds in the first irradiation step.

In the aforementioned invention, the particles can be irradiated in a number of $5\times10^{14}$ to $5\times10^{17}$ particles/cm$^2$ in the first irradiation step.

In the aforementioned invention, the particles having energy may consist of an ion beam containing at least argon or oxygen.

In the aforementioned invention, the first film (103) can be deposited by an ion-assisted deposition method using an ion beam in the first film deposition step.

In the aforementioned invention, an ion beam of accelerating voltage at 100 to 2000 V can be used in the first film deposition step.

In the aforementioned invention, an ion beam of current density at 1 to 120 µA/cm$^2$ can be used in the first film deposition step.

In the aforementioned invention, the ion beam can be irradiated for 1 to 800 seconds in the first film deposition step.

In the aforementioned invention, the ion beam can be irradiated in a number of $1\times10^{13}$ to $5\times10^{16}$ particles/cm$^2$ in the first film deposition step.

In the aforementioned invention, the ion beam used in the first film deposition step may be an ion beam of oxygen, argon or a mixed gas of oxygen and argon.

In the aforementioned invention, the first film (103) can be deposited by repeating a sputtering treatment and a plasma treatment in the first film deposition step.

In addition, the second film (105) may not necessarily be deposited on the surface of the first film (103) coated on the surface of the substrate (101) subjected to the first irradiation step, and may be deposited on the surface of the substrate (101) subjected to the first irradiation step. That is, the method for depositing a film of the present invention comprises the irradiation step of irradiating particles having energy on the surface of the substrate (101), and the film deposition step of depositing the film (105) having oil repellency on the surface of the substrate (101) subjected to the irradiation step.

In the aforementioned invention, a second irradiation step of irradiating particles having energy on the first film (103) may be performed in advance of the second film deposition step.

In the aforementioned invention, particles having energy of accelerating voltage at 100 to 2000 V can be used in the second irradiation step.

In the aforementioned invention, particles having energy of current density at 1 to 120 µA/cm$^2$ can be used in the second irradiation step.

In the aforementioned invention, the particles can be irradiated for 1 to 800 seconds in the second irradiation step.

In the aforementioned invention, the particles can be irradiated in a number of $10^{13}$ to $5\times10^{17}$ particles/cm$^2$ in the second irradiation step.

In the aforementioned invention, the particles having energy used in the second irradiation step may consist of an ion beam containing at least argon.

Effect of the Invention

According to the present invention, particles having predetermined energy are irradiated on the surface of the substrate (the first irradiation step), and therefore appropriate concaves are formed on the surface of the substrate after the irradiation. If appropriate concaves are formed on the surface of the substrate, appropriate concaves are also formed on the surface of the first film deposited afterward. Therefore, the components constituting the second film having oil repellency (oil-repellent molecules), which are deposited thereafter, can also adhere to the concaves of the first film. Abrasion resistance of the second film deposited on the surface of the first film can be thereby improved to a practically sufficient level.

DESCRIPTION OF NUMERICAL NOTATIONS

100 . . . Oil-repellent substrate, 101 . . . substrate, 103 . . . first film, 105 . . . oil-repellent film (second film), 1, 1a . . . film deposition system, 2 . . . vacuum vessel, 30A . . . vapor deposition region, 34, 36 . . . vapor deposition source, 34a, 36a, 38a . . . shutter, 34b, 36b . . . crucible, 34c . . . electron gun, 34d . . . electron gun power supply, 38 . . . ion gun, 38b . . . adjustment wall, 5 . . . neutralizer, 5a . . . adjustment wall, 4 . . . rotary drum, 4a, 4a' . . . substrate holder, 40 . . . motor, 50 . . . crystal monitor, 51 . . . film thickness detector, 52 . . . controller, 53 . . . electric heater, 54 . . . temperature sensor, 60A . . . plasma treatment region, 60 . . . plasma generation means, 70 . . . reactive gas supply means, 71 . . . oxygen gas cylinder, 72 . . . massflow controller, 80A . . . sputtering region, 80 . . . sputtering means, 81a, 81b . . . sputtering electrode, 82a, 82b . . . target, 83 transformer, 84 . . . AC power supply, 90 . . . sputtering gas feeding means, 92 . . . sputtering gas cylinder.

MODES FOR CARRYING OUT THE INVENTION

Hereafter, embodiments of the aforementioned invention will be explained with reference to the drawings.

<<First Embodiment>>

In this embodiment, an example of the oil-repellent substrate obtainable by the film deposition method of the aforementioned invention is explained.

Figure 1:
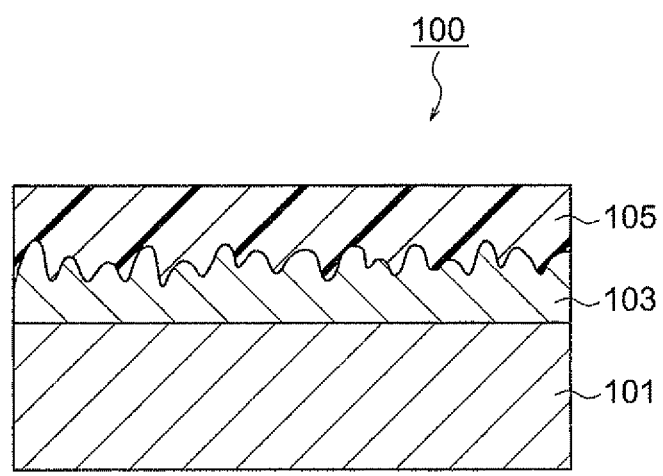
FIG. 1 is a sectional view of an oil-repellent substrate according to the first embodiment.

As shown in FIG. 1, the oil-repellent substrate 100 of this embodiment comprises the substrate 101, and the first film 103 is coated on at least one surface of the substrate 101. On the first film 103, the second film 105 having oil repellency (henceforth referred to as "oil-repellent film") is coated.

As the substrate 101, a plastic substrate (organic glass substrate) or an inorganic substrate (inorganic glass substrate) as well as a substrate of metal such as stainless steel can be used, and the thickness thereof is, for example, 0.1 to 5 mm. Examples of the inorganic glass substrate, which is an example of the substrate 101, include, for example, those of soda lime glass (6H to 7H), borosilicate glass (6H to 7H), and so forth. The numerals mentioned in the parentheses following the types of the inorganic glass of the substrate represent values of pencil hardness measured by the method defined in JIS-K5600-5-4.

First, the first film 103 is deposited by using a dry deposition process. For example, when the first film 103 is constituted with $SiO_2$, if it is coated by a wet deposition process such as the sol-gel method, sufficient scratch resistance may not be imparted, and as a result, the oil-repellent film 105 having practically sufficient abrasion resistance, which is described later, may not be deposited. The first film 103 is preferably constituted with a material showing pencil hardness higher than 9H measured by, for example, the method defined in JIS-K5600-5-4, including, for example, $SiO_2$, $ZrO_2$, $Si_3N_4$, $Al_2O_3$, and so forth. By coating the first film 103 consisting of a material having hardness higher than the hardness of the substrate 101 on the surface of the substrate 101, it is made easier to improve the abrasion resistance of the oil-repellent film 105 described later to a practically sufficient level.

Second, the surface characteristics (surface roughness) of the first film 103 are appropriately controlled so that appropriate concaves are formed on the surface. Specifically, center line average height (Ra), 10-point average height (Rz), and maximum valley depth (Pv) are appropriately adjusted. All of Ra, Rz, and Pv are indices indicating unevenness of the surface of the first film 103. In this embodiment, although the definition of the surface roughness (Ra, Rz, Pv) of the first film 103 is based on JIS-B0601, it is also surface roughness in a minute region or in a minute scale measured by using, for example, a non-contact surface roughness profiler, an atomic force microscope (AFM), or the like.

In order to improve abrasion resistance of the oil-repellent film 105 described later to a practically sufficient level, the inventors of the present invention conducted researches for forming appropriate concaves on the surface of the first film 103 with paying attention to the specific indices concerning the surface characteristics. As a result, they found that, by appropriately controlling values of Ra, Rz and Pv concerning surface roughness among many parameters representing surface characteristics, appropriate concaves were formed on the surface of the first film 103, and abrasion resistance of the oil-repellent film 105 coated thereafter could be improved to a practically sufficient level. That is, since the surface characteristics of the first film 103 according to this embodiment are appropriately controlled, abrasion resistance of the oil-repellent film 105 described later can be improved to a practically sufficient level.

According to this embodiment, Ra of the first film 103 is preferably adjusted to be 0.1 nm or larger, more preferably 1 nm or larger, still more preferably 3 nm or larger. If Ra of the first film 103 is adjusted to be the predetermined value or larger, even after the surface of the oil-repellent film 105 described later is scratched by rubbing with steel wool, components constituting the oil-repellent film 105 (oil-repellent molecules) adhering to the concaves of the first film 103 can be remained. As a result, expression of the oil repellency can be secured. On the other hand, when Ra of the first film 103 is too large, the oil repellency of the oil-repellent film 105 tends to be degraded. Therefore, in this embodiment, it is desirable that Ra of the first film 103 is preferably adjusted to be 1000 nm or smaller, more preferably 100 nm or smaller, still more preferably 20 nm or smaller.

According to this embodiment, Rz of the first film 103 is preferably adjusted to be 5 nm or larger, more preferably 7 nm or larger, still more preferably 10 nm or larger. If Rz of the first film 103 is adjusted to be the predetermined value or larger, even after the surface of the oil-repellent film 105 described later is scratched by rubbing with steel wool, components constituting the oil-repellent film 105 (oil-repellent molecules) adhering to the concaves of the first film 103 can be remained. As a result, expression of the oil repellency can be secured. On the other hand, when Rz of the first film 103 is too large, the oil repellency of the oil-repellent film 105 tends to be degraded. Therefore, in this embodiment, it is desirable that Rz of the first film 103 is preferably adjusted to be 2000 nm or smaller, more preferably 200 nm or smaller, still more preferably 50 nm or smaller.

According to this embodiment, Pv of the first film 103 is preferably adjusted to be 15 nm or larger, more preferably 20 nm or larger, still more preferably 30 nm or larger. If Pv of the first film 103 is adjusted to be the predetermined value or larger, even after the surface of the oil-repellent film 105 described later is scratched by rubbing with steel wool, components constituting the oil-repellent film 105 (oil-repellent molecules) adhering to the concaves of the first film 103 can be remained. As a result, expression of the oil repellency can be secured. On the other hand, when Pv of the first film 103 is too large, the oil repellency of the oil-repellent film 105 tends to be degraded. Therefore, in this embodiment, it is desirable that Pv of the first film 103 is preferably adjusted to be 2000 nm or smaller, more preferably 300 nm or smaller, still more preferably 150 nm or smaller.

In this embodiment, the first film 103 is preferably prepared so that appropriate concaves are formed on the surface thereof, and the convexes observed on the surface thereof exist with predetermined periodic intervals. Specifically, it is desirable that convexes observed when the surface roughness of the first film 103 is measured by linear scanning preferably exist with periodic intervals of 0.1 to 5000 nm, more preferably 1 to 1000 nm, still more preferably 1 to 50 nm.

The periodic interval of the convexes existing on the surface of the first film 103 referred to here means an interval $\lambda$ between a certain convex to the next convex beyond a concave between them in the surface profile of the first film 103, and it can be calculated by dividing the linearly scanned (measured) length with the number of peaks counted. If the intervals of the convexes are adjusted to be within the aforementioned range, even after the surface of the oil-repellent film 105 described later is scratched by rubbing with steel wool, components constituting the oil-repellent film 105 (oil-repellent molecules) adhering to the concaves of the first film 103 can be remained. As a result, expression of the oil repellency can be secured.

Such measurement of the periodic intervals of the convexes existing on the surface of the first film 103 can be performed by using a non-contact surface profiler, an atomic force microscope (AFM), or the like, as in the case of Ra, Rz, etc. mentioned above.

For the reasons described above, the first film 103 according to this embodiment can be coated by a dry deposition process, for example, a dry plating method (PVD method) such as vacuum vapor deposition method (including ion-assisted deposition method), sputtering method, ion-plating method, and arcing deposition, not wet deposition process, with appropriately controlling the deposition conditions.

The first film 103 to be coated on the substrate 101 by the vacuum vapor deposition method, the sputtering method, or the like may be coated with a single layer or multiple layers.

Thickness of the first film 103 is, for example, 0.1 to 500 nm, preferably 5 to 50 nm. Unduly small or large thickness of the first film 103 may result in insufficient abrasion resistance of the surface, after the coating of the oil-repellent film 105 described later.

According to this embodiment, particles having energy are irradiated on the substrate 101 (first irradiation treatment, preoperative irradiation), and then the first film 103 is deposited on this substrate 101 subjected to the preoperative irradiation. The particles having energy are irradiated on the substrate 101 in advance of the deposition of the first film 103 in order to adjust the surface characteristics of the first film 103 deposited on the surface of the substrate 101 to be within the ranges described above.

Examples of the particles having energy include, for example, ion beam emitted by an ion gun, active species of reactive gas in plasma, and so forth. Therefore, when the first film 103 is coated by the ion-assisted deposition method with an ion beam, for example, before starting the deposition, an ion beam can be irradiated on the substrate 101 with predetermined irradiation conditions, and then ion-assisted deposition can be performed on the substrate 101 subjected to the preoperative irradiation, with continuing the irradiation of ion beam. On the other hand, when the first film 103 is coated by repetition of a sputtering step and a reaction step, before starting these treatments, an ion beam can be irradiated on the substrate 101 with predetermined irradiation conditions. Alternatively, active species in plasma for the reaction step may be irradiated on the substrate 101.

The oil-repellent film 105 has a function of preventing adhesion of oil stains. The expression "preventing adhesion of oil stains" used here means to attain not only a condition that oil stains do not adhere, but also a condition that oil stains can be easily wiped off, even if they adhere.

That is, the oil-repellent film 105 maintains oil repellency. Specifically, abrasion resistance of the oil-repellent film 105 of this embodiment is improved to such a practically sufficient level that even after it is reciprocally rubbed with steel wool #0000 at a load of 1 $kg/cm^2$ over 500 times (preferably 1000 times), ink of oily pen adhering to it can be wiped off. The abrasion resistance is improved as described above, because appropriate concaves are formed on the surface of the base for coating the oil-repellent film 105 (first film 103) by the treatment of irradiating energy particles mentioned above, so that the surface characteristics are controlled.

The oil-repellent film 105 can be constituted with an organic compound having at least one hydrophobic group and at least one reactive group that can bind with hydroxyl group in the molecule (also referred to simply as "hydrophobic reactive organic compound"), or the like. Examples of the hydrophobic reactive organic compound include, for example, fluorine-containing organic compounds containing a polyfluoroether group or a polyfluoroalkyl group, and so forth.

Thickness of the oil-repellent film 105 is preferably 0.5 to 100 nm, more preferably 1 to 20 nm.

The oil-repellent film 105 can be deposited by, for example, using the vacuum vapor deposition method, chemical vapor deposition (CVD) method, or the like, with appropriately controlling the deposition conditions thereof.

Although coating of the oil-repellent film 105 may be performed separately from coating of the first film 103 with different apparatuses, they are preferably performed successively in the same apparatus. Such film deposition scheme can be attained by changing the deposition source from the material for coating the first film 103 to the material for coating the oil-repellent film 105. The coating of the films can also be performed with a single deposition apparatus by providing a plurality of deposition sources.

In the oil-repellent substrate 100 according to this embodiment, the surface characteristics of the first film 103 coated on at least one surface of the substrate 101 are appropriately controlled as described above. Therefore, abrasion resistance of the oil-repellent film 105 coated on the surface of the first film 103 is improved to a practically sufficient level.

Therefore, the oil-repellent substrate 100 of this embodiment is preferably applied to uses requiring oil repellency, for example, various displays (for example, plasma display panel (PDP), cathode ray tube (CRT), liquid crystal display (LCD), electroluminescence display (ELD) etc.); showcases; cover glass such as that of watches and gauges; touch surfaces of touch-sensitive electronic equipments such as bank ATMs and ticket machines; various electronic equipments having such various displays as mentioned above such as cellular phones and personal computers; and so forth.

<<Second Embodiment>>
<<Film Deposition System>>

In this embodiment, an example of a film deposition system that enables production of the oil-repellent substrate 100 of FIG. 1 is explained. The film deposition system of this embodiment can implement the film deposition method of the aforementioned invention.

Figure 2:
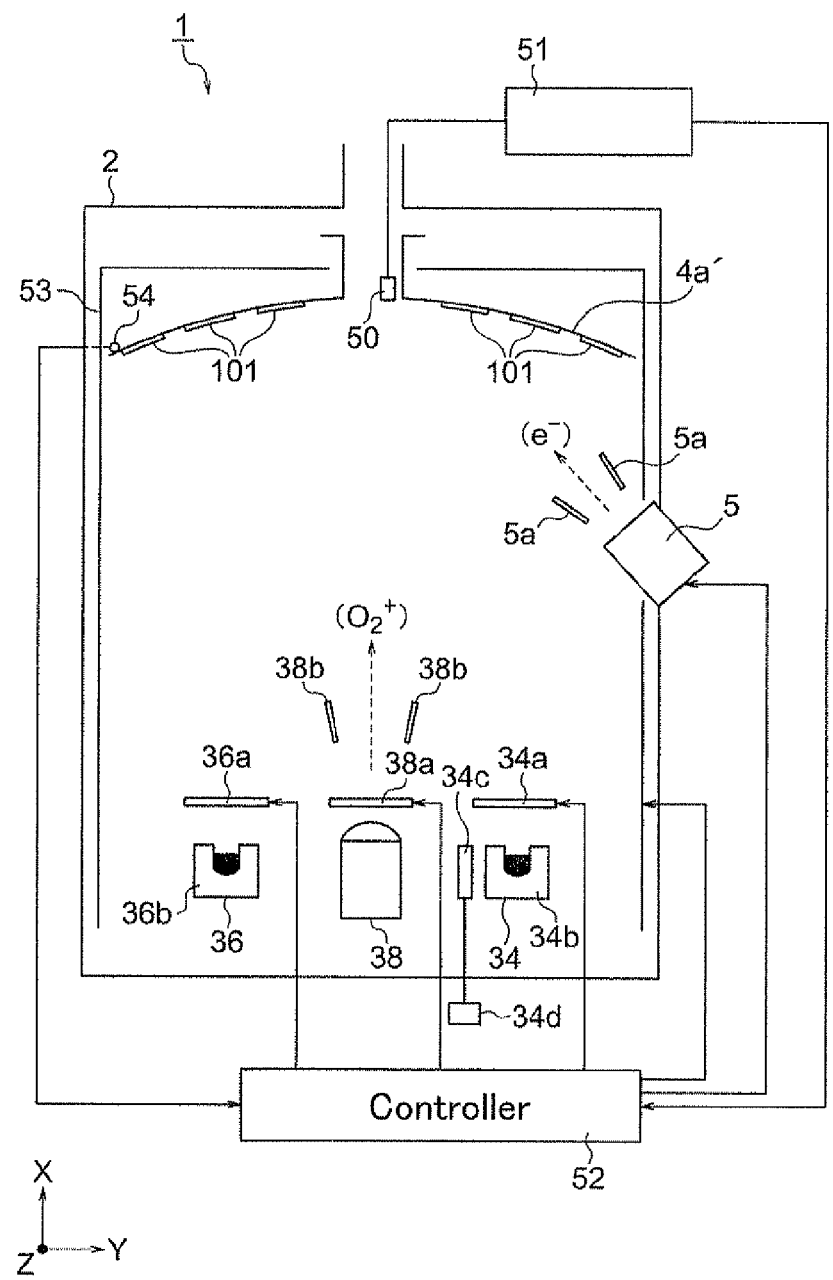
FIG. 2 is a sectional view of a film deposition system according to the second embodiment seen from the front, which enables production of the oil-repellent substrate of FIG. 1.

As shown in FIG. 2, the film deposition system 1 of this embodiment comprises a vertically disposed cylindrical vacuum vessel 2. The vacuum vessel 2 is constituted so that it is evacuated by an evacuating means (not shown in the drawing) to a predetermined pressure. A load lock chamber may be connected to the vacuum vessel 2 via a door. If a load lock chamber is provided, it becomes possible to carry in and out the substrate 101 with maintaining the vacuum in the vacuum vessel 2.

At an upper position in the vacuum vessel 2, a substrate holder 4a' made of stainless steel having a spherical shape is rotatably held around a vertical axis. An aperture is provided at the center of the substrate holder 4a', and a crystal monitor 50 is disposed there. The crystal monitor 50 detects physical film thickness by a thickness detector 51 on the basis of change of the resonance frequency due to deposition of a thin film on the surface thereof. The result of film thickness detection is sent to a controller 52.

In the inside of the vacuum vessel 2, an electric heater 53 is disposed so as to wrap the substrate holder 4a'. Temperature of the substrate holder 4a' is detected with a temperature sensor 54 such as a thermocouple, and the result is sent to the controller 52. The controller 52 controls the electric heater 53 using output from the temperature sensor 54 to appropriately control the temperature of the substrate 101.

At lower positions in the inside of the vacuum vessel 2, evaporation sources 34 and 36 for adhering materials for film deposition to the substrates 101 held by the substrate holder 4a', and an ion gun 38 for irradiating positive ions on the substrates 101 are disposed.

The evaporation source 34 is provided with a crucible (boat) 34b having a pitting for carrying a film deposition material on the upper part, an electron gun 34c for irradiating an electron beam ($e^-$) on the film deposition material to evaporate it, and a shutter 34a openably and closably disposed at a position for intercepting the film deposition material going to the substrates 101 from the crucible 34b. When the film deposition material is put on the crucible 34b, and electric power is supplied to the electron gun 34c by the electron gun power supply 34d to generate an electron beam from the electron gun 34c and irradiate this electron beam on the film deposition material, the film deposition material is heated and evaporated. If the shutter 34a is opened in such a state, the film deposition material evaporating from the crucible 34b moves towards the substrates 101 in the inside of the vacuum vessel 2, and adheres to the surfaces of the substrates 101.

The evaporation source 36 is an evaporation source of resistance heating type such as those of direct heating type and indirect heating type in this embodiment, and is provided with a crucible (boat) 36b having a pitting for carrying a film deposition material on the upper part, and a shutter 36a openably and closably disposed at a position for intercepting the film deposition material going to the substrates 101 from the crucible 36b. According to the direct heating method, electrodes are attached to the metal boat to flow electric current so as to directly heat the metal boat using the boat itself as an electrical resistance heater, and heat the film deposition material put into it. The indirect heating method is a method in which the boat is not a direct heat source, and it is heated by applying an electric current to a heating means separately disposed apart from the boat, for example, a deposition filament consisting of a rare metal such as a transition metal. If the film deposition material put on the crucible 36b is heated by the boat itself or a heater provided apart from the boat, and the shutter 36a is opened in this state, the film deposition material evaporating from the crucible 36b moves towards the substrates 101 in the inside of the vacuum vessel 2, and adhere to the surfaces of the substrates 101.

The ion gun 38 is an ion source for ion assistance, and it withdraws charged ions ($O^{2+}$, $Ar^+$) from plasma of reactive gas ($O_2$ etc.) or rare gas (Ar etc.) and radiates them towards the substrates 101 with acceleration at a predetermined accelerating voltage. Above the ion gun 38, a shutter 38a is openably and closably disposed. Adjustment walls 38b and 38b for adjusting directivity of the ions withdrawn by the ion gun 38 are provided above the shutter 38a.

With the collision energy of the cations irradiated from the ion gun 38, the film deposition material moved towards the substrates 101 from the evaporation sources 34 and 36 highly densely and firmly adheres to the surfaces of the substrates 101. At this time, the substrate 101 is positively charged with the cations contained in the ion beam.

In addition, there occurs a phenomenon that the whole substrate 101 is positively charged (charge up) due to accumulation of cations radiated from the ion gun 38 (for example, $O^{2+}$) in the substrate 101. If charge up occurs, abnormal discharge may occur between the positively charged substrate 101 and another member, and the thin film (insulating layer) coated on the surface of the substrate 101 may be destroyed by impact of the discharge. Further, since the collision energy of the cations radiated from the ion gun 38 is reduced by the positive charging of the substrate 101, denseness, adhesion strength, etc. of the thin film may be decreased.

Therefore, according to this embodiment, in order to electrically neutralize the positive charge accumulated in the substrate 101, a neutralizer 5 is disposed in the middle of the sidewall of the vacuum vessel 2. During the irradiation of the ion beam by the ion gun 38, the neutralizer 5 discharges electrons ($e^-$) towards the substrate 101, that is, it withdraws electrons from plasma of a rare gas such as Ar, and radiates them with acceleration by accelerating voltage. The electrons radiated from it neutralize electrification due to the ions adhering to the surface of the substrate 101. In addition, adjustment walls 5a and 5a for adjusting directivity of the electrons discharged from the neutralizer 5 are disposed above the neutralizer 5.

<<Method for Depositing Film>>

Hereafter, an example of the method for depositing a film using the film deposition system 1 will be explained.

In this embodiment, a case where metallic silicon (Si) or silicon oxide ($SiO_2$) is used as the first film deposition material charged in the boat of the evaporation source 34 is exemplified. The second film deposition material as a material for coating the oil-repellent film charged in the boat of the evaporation source 36 is not particularly limited.

Further, in this embodiment, there is exemplified a case where the first irradiation treatment (preoperative irradiation) is carried out with an ion beam generated by the ion gun for the substrate 101, then the first film 103 is deposited by the ion-beam assisted deposition method (IAD) using the ion gun, and the oil-repellent film 105 is further deposited by the vacuum vapor deposition method of resistance heating type.

Form of the first film deposition material is not particularly limited, and for example, the material in the form of a pellet can be used. The heating method for the first film deposition material is not limited to the electron beam heating method, and a heat source enabling sufficient heating for evaporating the deposition material, such as halogen lamp, sheathed heater, resistance heating, and induction heating can be used.

Form of the second film deposition material is not particularly limited, and for example, (a) a hydrophobic reactive organic compound impregnated in porous ceramics, or (b) a hydrophobic reactive organic compound impregnated in a mass of metal fibers or filaments can be used. These can quickly absorb a lot of the hydrophobic reactive organic compound, and evaporate it. The porous ceramics is preferably used in the form of pellet in view of handling property.

Examples of the metal fibers or filaments include, for example, those of iron, platinum, silver, copper, and so forth. As the metal fibers or filaments, it is preferable to use those of such an entangled state that they can hold a sufficient amount of the hydrophobic reactive organic compound, for example, those in the form of woven fabric or nonwoven fabric. Void ratio of the mass of metal fibers or filaments can be determined according to amount of the hydrophobic reactive organic compound to be held.

When a mass of metal fibers or filaments is used for the second film deposition material, it is preferably held in a container of which one end is opened. The mass of metal fibers or filaments held in a container can also be regarded as a pellet. Although shape of the container is not particularly limited, examples include those of Knudsen type, divergent nozzle type, straight cylinder type, divergent cylinder type, boat type, filament type, and so forth, and type of the container can be suitably chosen according to the specification of the vapor deposition apparatus. At least one end of the container is opened, so that the hydrophobic reactive organic compound evaporates from the open end. As the material of the container, metals such as copper, tungsten, tantalum, molybdenum and nickel, ceramics such as alumina, carbon, and so forth can be used, and it is appropriately chosen according to types of the vapor deposition apparatus, the hydrophobic reactive organic compound, and so forth.

Sizes of both the porous ceramic pellet and the pellet consisting of a mass of metal fibers or filaments held in a container are not limited.

When porous ceramics or a mass of metal fibers or filaments is impregnated with the hydrophobic reactive organic compound, a solution of the hydrophobic reactive organic compound in an organic solvent is prepared first, porous ceramics or a mass of metal fibers or filaments is impregnated with the solution by the dipping method, dropping method, spraying method, or the like, and then the organic solvent is evaporated. Since the hydrophobic reactive organic compound has a reactive group (hydrolysable group), it is preferable to use an inert organic solvent.

Examples of the inert organic solvent include fluorine-modified aliphatic hydrocarbon solvents (perfluoroheptane, perfluorooctane, etc.), fluorine-modified aromatic hydrocarbon solvents (m-xylene hexafluoride, benzotrifluoride etc.), fluorine-modified ether solvents (methyl perfluorobutyl ether, perfluoro(2-butyltetrahydrofuran) etc.), fluorine-modified alkylamine solvents (perfluorotributylamine, perfluorotripentylamine etc.), hydrocarbon solvents (toluene, xylene etc.), ketone solvents (acetone, methyl ethyl ketone, methyl isobutyl ketone etc.), and so forth. These organic solvents can be used independently or as any combination of two or more kinds of them. Concentration of the hydrophobic reactive organic compound solution is not limited, and it can be appropriately determined according to shape of the carrier to be impregnated with the hydrophobic reactive organic compound.

The method for heating the second film deposition material is not limited to the resistance heating method, and a halogen lamp, sheathed heater, electron beam, plasma electron beam, induction heating, and so forth can be used.

(1) First, a plurality of the substrates 101 are fixed on the substrate holder 4a'. The substrates 101 fixed on the substrate holder 4a' can be constituted from glass, plastics or metal processed into a tabular shape, lenticular shape, or the like. In addition, the substrates 101 are preferably subjected to wet cleaning before or after the fixation.

(2) Then, after the substrate holder 4a' is set in the inside of the vacuum vessel 2, the inside of the vacuum vessel 2 is evacuated to about $10^{-4}$ to $10^{-2}$ Pa. If the pressure is lower than $10^{-4}$ Pa, too much time may be required for the evacuation to degrade the productivity. On the other hand, if pressure is higher than $10^{-2}$ Pa, film deposition may become insufficient, and thus film characteristics may be degraded.

(3) Then, the electric heater 53 is electrified and thereby made to generate heat, and the substrate holder 4a' is rotated at a low speed. This rotation provides uniform temperature and uniform film deposition conditions of a plurality of the substrates 101. When the controller 52 determines that the temperature of the substrates 101 has reached a temperature of from, for example, ordinary temperature to 120° C., preferably 50 to 90° C., according to the output of the temperature sensor 54, it starts the film deposition step. If the substrate temperature is lower than ordinary temperature, there is observed a tendency that density of the first film 103 to be deposited becomes low, and sufficient durability of the film cannot be obtained. If the substrate temperature exceeds 120° C., plastic substrates used as the substrates 101 may be degraded or deformed. In addition, when a material suitable for unheated film deposition is used, the film deposition may be carried out at ordinary temperature.

In this embodiment, before starting the film deposition step, the ion gun 38 is made to be in an idling operation state. Further, the evaporation sources 34 and 36 are also prepared so that the first film deposition material and the second film deposition material can be immediately diffused (discharged) by opening operation of the shutters 34a and 36a.

Figure 7:
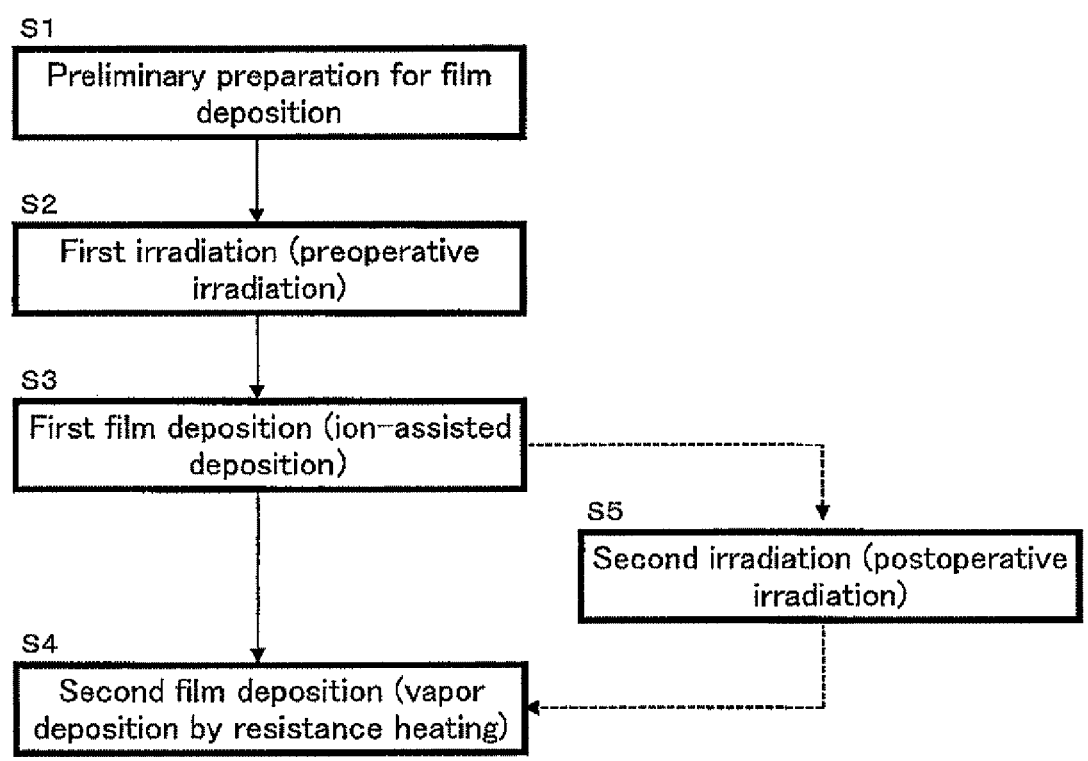
FIG. 7 is a flowchart showing flow of a film deposition method using the film deposition system shown in FIG. 2.

The above is the preliminary preparation for the film deposition in the step (henceforth abbreviated as S) 1 mentioned in FIG. 7.

(4) Then, in S2 mentioned in FIG. 7, the controller 52 increases the irradiation electric power for the ion gun 38 from that of the idling state to a predetermined irradiation electric power, and opens the shutter 38a to irradiate an ion beam on the surface of the substrate 101 under rotation. This step is an example of the first irradiation treatment (preoperative irradiation). This embodiment is characterized in that the preoperative irradiation is performed for the surface of the substrate 101 in advance of the deposition of the first film 103 described later. The surface portion of the substrate 101 is shaved off by the preoperative irradiation performed for the substrate 101, and as a result, appropriate concaves can be imparted to the surface of the first film 103, which is deposited on the surface of the substrate 101 afterward.

The conditions of the preoperative irradiation are as follows.

As for type of the gas introduced into the ion gun 38, it is sufficient that it contains at least argon or oxygen, and it may be a mixed gas of argon and oxygen. However, it is preferably a mixed gas of argon and oxygen. Volume to be introduced of the gas of the aforementioned type (total volume in the case of a mixed gas) is, for example, 10 to 100 sccm, preferably 20 to 70 sccm. The unit "sccm" is an abbreviation for "standard cc/m", and indicates a value at 0° C. and 101.3 kPa (1 atmosphere).

The accelerating voltage (V3) of the ions is, for example, 100 to 2000 V, preferably 200 to 1500 V. The current density (I3) of the ions is, for example, 1 to 120 $\mu A/cm^2$, preferably 5 to 50 $\mu A/cm^2$.

The irradiation time (T3) of the ions is, for example, 60 to 1200 seconds, preferably 120 to 900 seconds, more preferably 180 to 720 seconds. The value obtained by dividing the product of I3 and T3 with the elementary electric charge of electron e ($=1.602 \times 10^{-19}$ C) ($=(I3 \times T3)/e$) represents number of ions to be irradiated, and in this embodiment, the ion beam is preferably irradiated at an irradiated ion number in the range of, for example, $5 \times 10^{14}$ to $5 \times 10^{17}$ particles/cm$^2$, preferably $10^{15}$ to $10^{17}$ particles/cm$^2$, more preferably $10^{16}$ to $10^{17}$ particles/cm$^2$.

In addition, the irradiation energy density ($=V3 \times I3 \times T3$) can also be controlled by, for example, shortening the irradiation time (T3) for increasing the irradiation electric power density, or lengthening the irradiation time (T3) for decreasing the irradiation electric power density.

If the intensity of the preoperative irradiation as the condition thereof is too strong or too weak, appropriate concaves may not be imparted to the surface of the first film 103 deposited on the surface of the substrate 101, and sufficient abrasion resistance may not be imparted to the first film 103.

As a result, the second film 105 (oil-repellent film) having practically sufficient abrasion resistance may not be deposited.

(5) Then, in S3 mentioned in FIG. 7, the controller 52 maintains the shutter 38a to be opened, and changes the irradiation electric power for the ion gun 38 to a predetermined power to continue the irradiation of ion beam. In this state, the controller 52 opens the shutter 34a to perform ion beam-assisted deposition (IAD) of the first film deposition material (first film deposition process). The operation of the neutralizer 5 is also started at this time. That is, the step of dispersing the first film deposition material from the evaporation source 34, the step of irradiating an ion beam of introduced gas (oxygen in this case) withdrawn from the ion gun 38, and the step of irradiating electrons, to the film deposition surface of the substrate 101, are performed in parallel (first film deposition process).

The ion-assisting conditions of the ion beam are as follows.

As for type of the gas introduced into the ion gun 38, for example, oxygen, argon, or a mixed gas of oxygen and argon is preferred. Volume of the gas of the aforementioned type introduced into the ion gun 38 (total volume in the case of a mixed gas) is, for example, 1 to 100 sccm, preferably 5 to 50 sccm.

The accelerating voltage (V1) of the ions is, for example, 100 to 2000 V, preferably 200 to 1500 V. The current density (I1) of the ions is, for example, 1 to 120 $\mu A/cm^2$, preferably 5 to 50 $\mu A/cm^2$.

The irradiation time (T1) of the ions is, for example, 1 to 800 seconds, preferably 10 to 100 seconds. The value obtained by dividing the product of I1 and T1 with the elementary electric charge of electron e ($=1.602 \times 10^{-19}$ C) ($=(I1 \times T1)/e$) represents number of ions to be irradiated, and in this embodiment, the ion beam can be irradiated at an irradiated ion number in the range of, for example, $1 \times 10^{13}$ to $5 \times 10^{16}$ particles/cm$^2$, preferably $5 \times 10^{13}$ to $5 \times 10^{14}$ particles/cm$^2$.

In addition, the irradiation energy density ($=V1 \times I1 \times T1$) can also be controlled by, for example, shortening the irradiation time (T1) for increasing the irradiation electric power density, or lengthening the irradiation time (T1) for decreasing the irradiation electric power density.

The operation conditions of the neutralizer 5 are as follows.

As for type of the gas introduced into the neutralizer 5, it is, for example, argon. Introduction volume of the gas of the aforementioned type is, for example, 10 to 100 sccm, preferably 30 to 50 sccm.

The accelerating voltage of electrons is, for example, 20 to 80 V, preferably 30 to 70 V. The electronic current may be such a current that an electric current higher than the ionic current is supplied.

As the first film 103, three-dimensional nuclei are deposited on the substrate 101 first at an early stage of the film deposition, and then they grow with increase of the film deposition amount (vapor deposition amount), combine together, and eventually grow into a continuous film (island growth).

As described above, the first film 103 consisting of $SiO_2$ is coated on the surface of the substrate 101 with a predetermined thickness. The controller 52 continues monitoring of the thickness of the thin film coated on the substrate 101 with the crystal monitor 50, and when it reaches a predetermined thickness, the controller 52 terminates the film deposition.

(6) Then, in S4 mentioned in FIG. 7, the controller 52 returns the irradiation electric power of the ion gun 38 to the level of the idling state, closes the shutters 34a and 38a, and opens the shutter 36a to perform vacuum vapor deposition of the second film deposition material as a raw material for coating an oil-repellent film by the resistance heating method (second film deposition process). That is, to the surface of the first film 103, the second film deposition material is dispersed, for example, for 3 to 20 minutes, from the evaporation source 36 to perform the film deposition process (second film deposition process). As a result, the oil-repellent film 105 is coated on the first film 103 in a predetermined thickness (for example, 1 to 50 nm). The controller 52 continues monitoring of the thickness of the thin film deposited on the first film 103 with the crystal monitor 50, and when it reaches a predetermined thickness, the controller 52 terminates the vapor deposition. By the aforementioned steps, the oil-repellent substrate 100 shown in FIG. 1 is produced.

According to the method for depositing a film using the film deposition system 1 of this embodiment, an ion beam of the gas to be introduced as an example of the energy particles is irradiated on the surface of the substrate 101 in advance of the film deposition of the first film 103 (preoperative irradiation). Appropriate concaves are thereby formed on the surface of the substrate 101 subjected to the irradiation of ion beam, and as a result, appropriate concaves are also formed on the surface of the first film 103 to be deposited on the surface of the substrate 101. Accordingly, the oil-repellent molecules as constituent components of the oil-repellent film 105 to be deposited thereafter can be adhered to the concaves of the first film 103. By adhering the constituent components of the oil-repellent film 105 to the concaves of the first film 103, even if oil components such as fingerprint components adhering to the surface of the oil-repellent film 105 are wiped off with a heavy load (for example, load of about 1 kg/cm$^2$), the constituent components of the oil-repellent film 105 can be effectively remained on the outermost surface. That is, according to this embodiment, it becomes possible to coat the oil-repellent film 105 having abrasion resistance of a practically sufficient level.

For the embodiment described above, an example where only the SiO$_2$ thin film is coated as the first film 103 on the substrate 101 is described. However, together with this SiO$_2$ thin film, another thin film such as a Si$_3$N$_4$ thin film and a ZrO$_2$ thin film can also be deposited. Further, as the first film 103 coated on the substrate 101, another thin film such as a Si$_3$N$_4$ thin film and a ZrO$_2$ thin film may be coated instead of the SiO$_2$ thin film. For these purposes, the material or shape of the first film deposition material charged in the deposition source 34 may be changed in any of these cases.

Further, in the embodiment described above, particles having energy may also be irradiated on the surface of the first film 103 in advance of the second film deposition process (second irradiation treatment, postoperative irradiation, refer to S5 mentioned in FIG. 7). In this case, when the first film deposition process is terminated, the controller 52 closes only the shutter 34*a*, and maintains the shutter 38*a* to be opened. In this state, the controller 52 can change the irradiation electric power for the ion gun 38 to a predetermined level of irradiation electric power to continue the irradiation of ion beam. By successively perform the preoperative irradiation for the surface of the substrate 101 and the postoperative irradiation for the surface of the first film 103, more appropriate concaves can be imparted to the surface of the first film 103.

The conditions of the postoperative irradiation may be the same as or different from those of the preoperative irradiation mentioned above. The conditions are, for example, as follows.

As for type of the gas introduced into the ion gun 38, it is sufficient that it contains at least argon or oxygen, and it may be a mixed gas of argon and oxygen, but it preferably contains at least argon. Volume to be introduced of the gas of the aforementioned type (total volume in the case of a mixed gas) is, for example, 10 to 100 sccm, preferably 20 to 70 sccm.

The accelerating voltage (V2) of the ions is, for example, 100 to 2000 V, preferably 200 to 1500 V. The current density (I2) of the ions is, for example, 1 to 120 μA/cm$^2$, preferably 5 to 50 μA/cm$^2$.

The irradiation time (T2) of the ions is, for example, 1 to 800 seconds, preferably 10 to 100 seconds. The value obtained by dividing the product of I2 and T2 with the elementary electric charge of electron e ($-1.602 \times 10^{-19}$ C) (=(I2×T2)/e) represents number of ions to be irradiated, and, the ion beam can be irradiated at an irradiated ion number in the range of, for example, $10^{13}$ to $5 \times 10^{17}$ particles/cm$^2$, preferably $10^{13}$ to $10^{17}$ particles/cm$^2$, more preferably $10^{14}$ to $10^{16}$ particles/cm$^2$. In addition, the irradiation energy density (=V2×I2×T2) can also be controlled by, for example, shortening the irradiation time (T2) for increasing the irradiation electric power density, or lengthening the irradiation time (T2) for decreasing the irradiation electric power density.

Further, although the preoperative irradiation is performed for the substrate 101, and then the oil-repellent film 105 as the second film is deposited via the first film 103 in the explanation of this embodiment described above, the deposition of the first film 103 may be omitted, and the oil-repellent film 105 may be deposited directly on the surface of the substrate 101 subjected to the preoperative irradiation. The inventors of the present invention confirmed that the object of the present invention could also be achieved by such an embodiment, although achievable effect was slightly inferior to that obtained by providing the first film 103.

<<Third Embodiment>>
<<Film Deposition System>>

In this embodiment, another example of the film deposition system enabling production of the oil-repellent substrate 100 of FIG. 1 is explained. The same numerical notations as those of the second embodiment are given to the same members, and explanations thereof are omitted.

Figure 3:
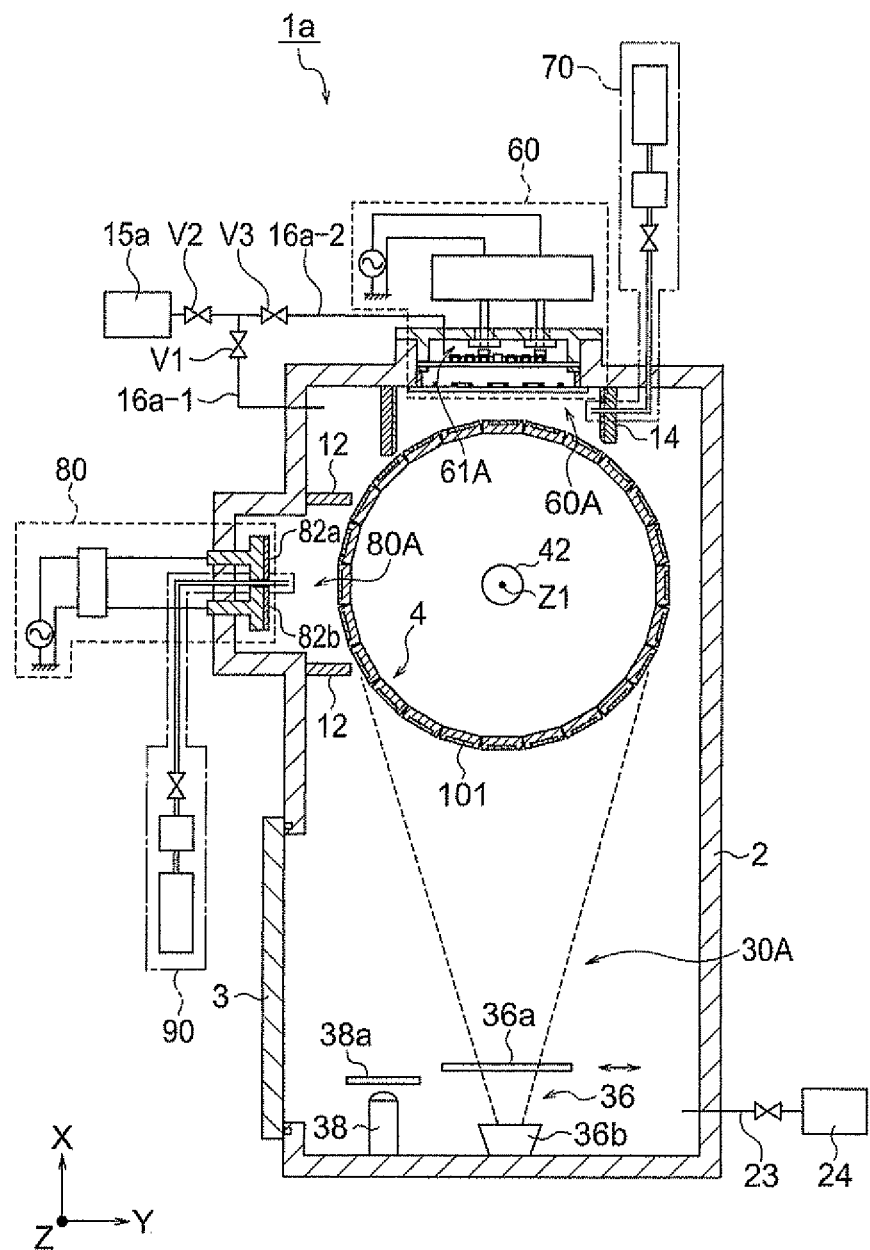
FIG. 3 is a sectional view of a film deposition system according to the third embodiment seen from the front, which enables production of the oil-repellent substrate of FIG. 1.

As shown in FIG. 3, the film deposition system 1*a* of this embodiment comprises a vacuum vessel 2. At an upper position in the inside of the vacuum vessel 2, a rotary drum 4 is rotatably held around an axis perpendicular to the vertical axis. The rotary drum 4 as a substrate holding mechanism is a cylindrical member for holding the substrate 101 on which film deposition is performed in the inside of the vacuum vessel 2.

Figure 4:
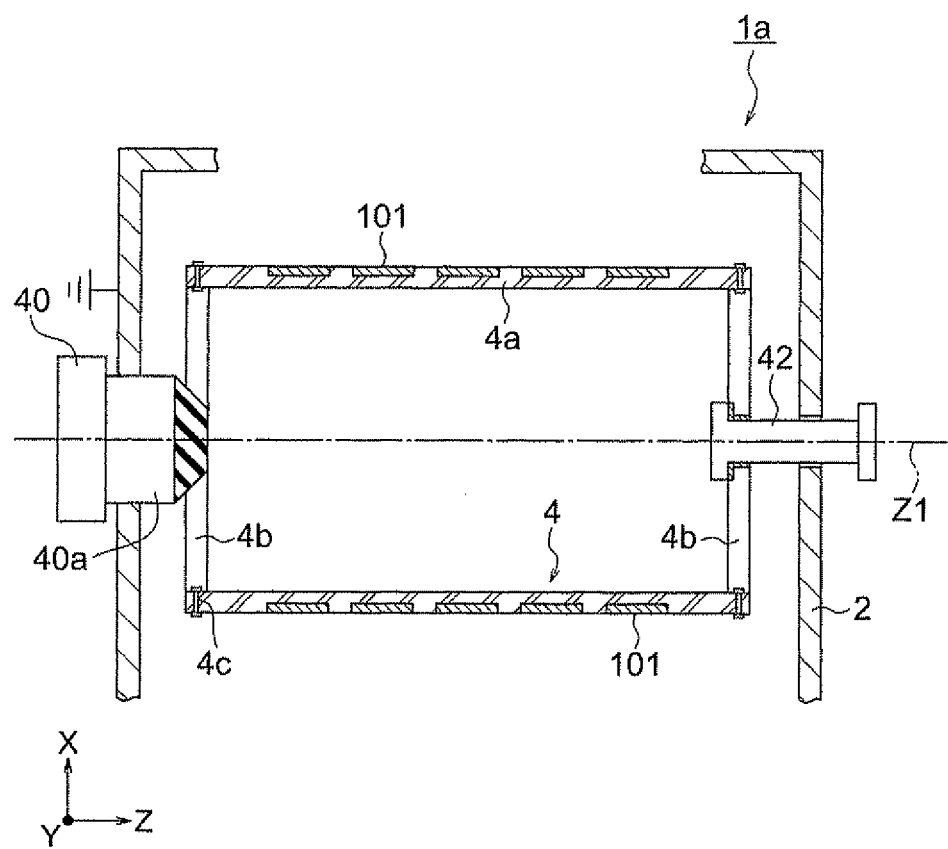
FIG. 4 is a sectional view of an important part of the film deposition system of FIG. 3 seen from the side.

As shown in FIG. 4, the rotary drum 4 comprises a plurality of substrate holders 4*a*, frames 4*b*, and connection means 4*c* for connecting the substrate holders 4*a* and the frames 4*b*.

The substrate holder 4*a* has a plurality of substrate holding holes for holding the substrates 101 on a center part of the plate surface in a row along the longer direction of the substrate holder 4*a*. The substrate 101 is held in the substrate holding hole of the substrate holder 4*a*, and fixed to the substrate holder 4*a* with a screw member or the like so that it should not drop out of the holder. Further, at the both ends of the substrate holder 4*a* along the longer direction (z-direction), screw holes into which the connection means 4*c* can be inserted are provided on the plate surface.

The frame 4*b* consists of two ring members disposed on the upper and lower sides (x-direction). In each of the ring members, screw holes are provided at positions corresponding to the screw holes of the substrate holder 4*a*. The substrate holder 4*a* and the frame 4*b* are fixed by using the connection means 4*c* consisting of, for example, a bolt and a nut.

The rotary drum 4 is constituted so that it can move between the inside of the vacuum vessel 2 and a load lock chamber connected to the vacuum vessel 2 through a door. The rotary drum 4 is disposed in the inside of the vacuum vessel 2 so that the central axis line Z1 along the cylindrical direction of the cylinder (z-direction) corresponds to the anterior-posterior direction of the vacuum vessel 2 (z-direction).

When the substrate holder 4a is attached to the frame 4b or detached from the frame 4b, the rotary drum 4 is conveyed to the load lock chamber, and the substrate holder 4a is detached from and attached to the frame 4b in this load lock chamber. On the other hand, at the time of film deposition, the rotary drum 4 is conveyed to the inside of the vacuum vessel 2, and rotatably disposed in the vacuum vessel 2.

The posterior surface center part of the rotary drum 4 has a shape that can engage with the front of a motor rotating shaft 40a. The rotary drum 4 and the motor rotating shaft 40a are positioned so that the central axis line of the motor rotating shaft 40a and the central axis line Z1 of the rotary drum 4 should coincide with each other, and are connected by engagement of them. The surface of the rotary drum 4 in the posterior surface thereof that engages with the motor rotating shaft 40a consists of an insulating member. Abnormal discharge of the substrate 101 can be thereby prevented. Further, airtightness between the vacuum vessel 2 and the motor rotating shaft 40a is maintained with an O-ring.

The motor rotating shaft 40a is rotated by driving a motor 40 provided behind the vacuum vessel 2 in a state that vacuum in the inside of the vacuum vessel 2 is maintained. With this rotation, the rotary drum 4 connected with the motor rotating shaft 40a rotates around the axis line Z1. Since each substrate 101 is held on the rotary drum 4, it revolves around the axis line Z1 as a revolution axis with rotation of the rotary drum 4.

The drum-rotating shaft 42 is provided on the front of the rotary drum 4, and the drum-rotating shaft 42 also rotates with the rotation of the rotary drum 4. A hole is formed in the front wall (z-direction) of the vacuum vessel 2, and the drum-rotating shaft 42 penetrates this hole and leads to the outside of the vacuum vessel 2. Bearing is provided on the internal surface of the hole and allows smooth rotation of the rotary drum 4. Between the vacuum vessel 2 and the drum-rotating shaft 42, airtightness is maintained with an O-ring.

<<Sputtering Region and Sputtering Means>>

Returning back to FIG. 3, a partition wall 12 is provided on the side of the vacuum vessel 2 in the vertical direction (x-direction) at a position facing the rotary drum 4. The partition wall 12 is a member made from the same stainless steel as that of the vacuum vessel 2. The partition wall 12 is constituted by planar members each disposed up and down, and left and right, and disposed from the internal wall of the vacuum vessel 2 towards the rotary drum 4 so as to form a closed square. A sputtering region 80A is thereby partitioned in the inside of the vacuum vessel 2.

The sidewall of the vacuum vessel 2 has a section having a convex projecting outward, and a sputtering means 80 is provided on the projecting wall surface.

The sputtering region 80A is formed in a region surrounded by the internal wall of the vacuum vessel 2, the partition wall 12, the external surface of the rotary drum 4, and the sputtering means 80. In the sputtering region 80A, a sputtering treatment for depositing a film material on the surface of the substrate 101 is performed.

Figure 5:
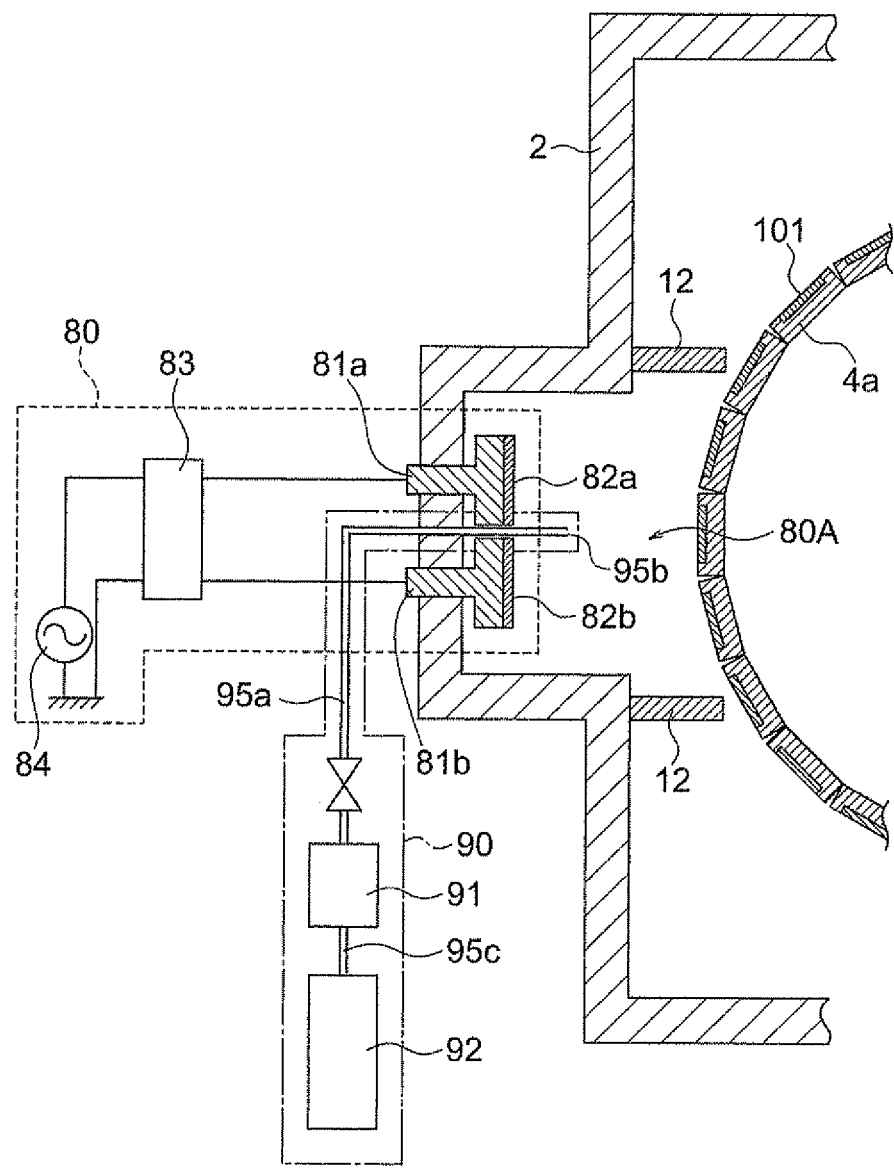
FIG. 5 is an enlarged explanatory view of a part of the film deposition system of FIG. 3 around the sputtering region.

As shown in FIG. 5, the sputtering means 80 is constituted by a pair of targets 82a and 82b, a pair of sputtering electrodes 81a and 81b holding the targets 82a and 82b, an AC power supply 84 for supplying electric power to the sputtering electrodes 81a and 81b, and a transformer 83 as an electric power control means for controlling electric power from the AC power supply 84.

The wall surface of the vacuum vessel 2 is projected outward, and the sputtering electrodes 81a and 81b are disposed on the internal wall of the vacuum vessel 2 at the projected portion so as to penetrate the sidewall. These sputtering electrodes 81a and 81b are fixed to the vacuum vessel 2 at the earth potential via insulating members.

The targets 82a and 82b consist of the first film deposition material formed in the form of a plate, and they are held by the sputtering electrodes 81a and 81b, respectively, so as to face the side of the rotary drum 4 as described later. In this embodiment, as the targets 82a and 82b, a material to which hardness higher than the hardness of the substrate 101 can be imparted by oxidation, nitridation or oxynitridation, such as metallic silicon (Si), aluminum (Al) and zirconium (Zr), is used. In this embodiment, use of a Si target is exemplified.

The sputtering electrodes 81a and 81b have a structure that a plurality of magnets are disposed in a predetermined direction. The sputtering electrodes 81a and 81b are connected to the AC power supply 84 via the transformer 83, and constituted so that an alternating electric field of 1 to 100 kHz can be applied to the both electrodes. The targets 82a and 82b are held by the sputtering electrodes 81a and 81b, respectively. The targets 82a and 82b have a plate shape, and as shown in FIG. 2, the targets 82a and 82b are disposed so that the longer direction thereof is parallel to the rotating-shaft line Z1 of the rotary drum 4.

A sputtering gas feeding means 90 for supplying a sputtering gas such as argon is provided around the sputtering region 80A. The sputtering gas feeding means 90 comprises a sputtering gas cylinder 92 as a sputtering gas storage means, piping 95a and piping 95c as a sputtering gas supply route, and a massflow controller 91 as a sputtering gas flow rate control means for controlling flow rate of the sputtering gas.

Examples of the sputtering gas include, for example, an inert gas such as argon and helium.

The sputtering gas cylinder 92 and the massflow controller 91 are both provided outside the vacuum vessel 2. The massflow controller 91 is connected to the single sputtering gas cylinder 92 storing the sputtering gas via the piping 95c. The massflow controller 91 is connected to the piping 95a, and one end of the piping 95a penetrates the sidewall of the vacuum vessel 2 and leads to neighborhood of the targets 82a and 82b in the sputtering region 80A.

The end of the piping 95a is disposed below the targets 82a and 82b near the center of them, and a feed port 95b is opened at the tip thereof towards the center of the front surfaces of the targets 82a and 82b.

The massflow controller 91 is an apparatus for controlling flow rate of the gas, and comprises an inlet through which the gas from the sputtering gas cylinder 92 flows in, an outlet for flowing the sputtering gas into the piping 95a, a sensor for detecting massflow rate of the gas, a control valve for controlling flow rate of the gas, a sensor for detecting massflow rate of the gas flown in via the inlet, and an electronic circuit for controlling the control valve on the basis of the flow rate detected by the sensor. The electronic circuit is designed so that a desired flow rate can be set from the outside.

The sputtering gas fed from the sputtering gas cylinder 92 is introduced into the piping 95a at a flow rate controlled by the massflow controller 91. The sputtering gas flown into the piping 95a is introduced from the feed port 95b into the region in front of the targets 82a and 82b disposed in the sputtering region 80A.

In a state that the sputtering gas is supplied to the sputtering region 80A by the sputtering gas feeding means 90, and the targets 82a and 82b are surrounded by an inert gas atmosphere, if an alternate current is applied to the sputtering electrodes 81a and 81b from the AC power supply 84, a part of the sputtering gas around the targets 82a and 82b emits electrons, and it is thereby ionized. Since a leakage magnetic field is formed on the surfaces of the targets 82a and 82b by the magnets disposed in the sputtering electrodes 81a and 81b, those electrons go around in the magnetic field generated near the surfaces of the targets 82a and 82b with describing a toroidal curve. Intense plasma is generated along the orbits of the electrons, and ions of the sputtering gas are accelerated towards the plasma, and collide with the targets 82a and 82b to drive out atoms and particles of the surfaces of the targets 82a and 82b (Si atoms and Si particles when the targets 82a and 82b consist of Si). The Si atoms and Si particles driven out adhere to the surface of the substrate 101 to coat a microfilm.

<<Plasma Treatment Region and Plasma Generation Means>>

Returning back to FIG. 3, a partition wall 14 is disposed on the upper internal wall of the vacuum vessel 2 in the vertical direction (x-direction) at a position facing the rotary drum 4. The partition wall 14 is a member made from, for example, the same stainless steel as that of the vacuum vessel 2. The partition wall 14 is constituted by planar members each disposed up and down, and left and right, and disposed from the internal wall of the vacuum vessel 2 towards the rotary drum 4 so as to form a closed square. A plasma treatment region 60A is thereby partitioned in the inside of the vacuum vessel 2. Thus, in this embodiment, the plasma treatment region 60A is provided at a position opposite to the vapor deposition region 30A with respect to the rotary drum 4 (upper part of the vacuum vessel 2 in the vertical direction, in a direction of substantially 180° from the vapor deposition region 30A), remote from the sputtering region 80A by an angle of substantially 90°, and spatially separated from both the vapor deposition region 30A and the sputtering region 80A.

The upper internal wall of the vacuum vessel 2 has a section having a convex projecting outward (upward), and a plasma generation means 60 is provided on the projected wall surface so as to face the plasma treatment region 60A.

The plasma treatment region 60A is formed in a region surrounded by the internal wall surface of the vacuum vessel 2, the partition wall 14, the external surface of the rotary drum 4, and the plasma generation means 60, and coats a thin film consisting of a compound or incompletely-reacted compound of Si by a reactive treatment of the microfilm adhered to the surface of the substrate 101 in the sputtering region 80A.

Figure 6:
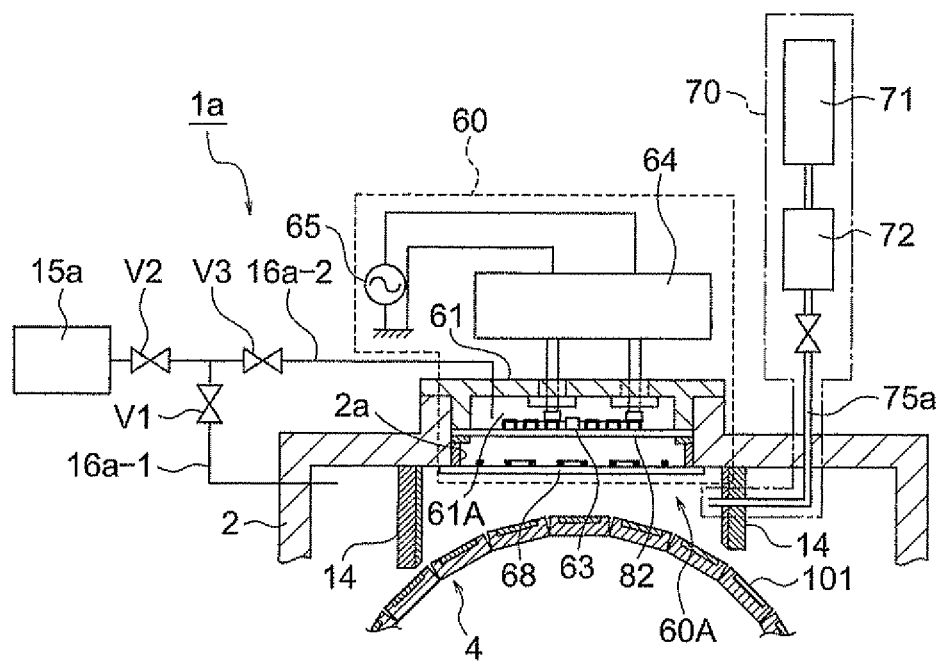
FIG. 6 is an enlarged explanatory view of a part of the film deposition system of FIG. 3 around the plasma treatment region.

As shown in FIG. 6, at a position on the upper wall surface of the vacuum vessel 2 corresponding to the plasma treatment region 60A, a hole 2a for installing the plasma generation means 60 is formed. Further, the piping 75a is connected to the plasma treatment region 60A. The massflow controller 72 is connected to one end of the piping 75a, and this massflow controller 72 is further connected to the reactive gas cylinder 71. Therefore, the reactive gas can be supplied from the reactive gas cylinder 71 into the plasma treatment region 60A.

The plasma generation means 60 comprises a case 61, a dielectric plate 62, an antenna 63, a matching box 64, and a radio frequency power supply 65.

The case 61 has a shape closing the hole 2a formed on the wall surface of the vacuum vessel 2, and is fixed with bolts so as to close the hole 2a of the vacuum vessel 2. By fixing the case 61 on the wall surface of the vacuum vessel 2, the plasma generation means 60 is attached to the wall surface of the vacuum vessel 2. The case 61 is formed with stainless steel.

The dielectric plate 62 is formed with a tabular dielectric substance. Although the dielectric plate 62 is formed with quartz in this embodiment, the material of the dielectric plate 62 is not limited to quartz, and it may be one formed with a ceramic material such as $Al_2O_3$. The dielectric plate 62 is fixed to the case 61 with a fixing frame. By fixing the dielectric plate 62 to the case 61, an antenna housing 61A is formed in a region surrounded by the case 61 and the dielectric plate 62.

The dielectric plate 62 fixed to the case 61 is disposed so as to face the inside of the vacuum vessel 2 (plasma treatment region 60A) through the hole 2a. In this configuration, the antenna housing 61A is separated from the inside of the vacuum vessel 2. That is, the antenna housing 61A and the inside of the vacuum vessel 2 are partitioned by the dielectric plate 62 to form independent spaces. Further, the antenna housing 61A and the outside of the vacuum vessel 2 are partitioned by the case 61 to form independent spaces. In this embodiment, the antenna 63 is disposed in the antenna housing 61A formed as an independent space as described above. In addition, airtightness between the antenna housing 61A and the inside of the vacuum vessel 2, and between the antenna housing 61A and the outside of the vacuum vessel 2 is maintained with an O-ring, respectively.

In this embodiment, a piping 16a-2 is branched from a piping 16a-1. This piping 16a-2 is connected to the antenna housing 61A, and has a role of functioning as an exhausting pipe at the time of evacuating the inside of the antenna housing 61A to obtain vacuum.

Valves V1 and V2 are provided in the piping 16a-1 at positions on the way of from a vacuum pump 15a to the inside of the vacuum vessel 2. Further, a valve V3 is provided in the piping 16a-2 at a position on the way of from the vacuum pump 15a to the antenna housing 61A. By closing either one of the valves V2 and V3, movement of gas between the insides of the antenna housing 61A and the vacuum vessel 2 is prevented. Internal pressure of the vacuum vessel 2 and internal pressure of the antenna housing 61A are measured with a vacuum gage.

The film deposition system 1a of this embodiment (refer to FIG. 3) is provided with a control unit. Output of the vacuum gage is inputted into this control unit. The control unit has a function of controlling evacuation by the vacuum pump 15a on the basis of the inputted value measured by the vacuum gage to adjust degree of vacuum in the inside of the vacuum vessel 2 and the inside of the antenna housing 61A. According to this embodiment, the control unit controls opening and closing of the valves V1, V2, and V3, and thereby the insides of the vacuum vessel 2 and the antenna housing 61A can be independently or simultaneously evacuated.

According to this embodiment, by appropriately controlling the vacuum pump 15a, film deposition atmosphere in the sputtering region 80A can be stabilized.

The antenna 63 is a means for being supplied electric power from the radio frequency power supply 65 to generate an induction field inside the vacuum vessel 2 (plasma treatment region 60A) and generate plasma in the plasma treatment region 60A. The antenna 63 comprises a tubular body formed with copper, and a covering layer covering the body surface and formed with silver. That is, the body of the antenna 63 is formed with inexpensive and easily processible copper, which also shows low electric resistance, in the form of tube, and the surface of the antenna 63 is covered with silver of which electric resistance is lower than that of copper. The impedance of the antenna 63 for radio frequency is thereby reduced to efficiently flow an electric current through the antenna 63 and improve the efficiency of generation of plasma.

The film deposition system 1a of this embodiment (refer to FIG. 3) is configured so that an alternating voltage having a frequency of 1 to 27 MHz is applied to the antenna 63 from the radio frequency power supply 65 to generate plasma of a reactive gas in the plasma treatment region 60A.

The antenna 63 is connected to the radio frequency power supply 65 via the matching box 64 holding a matching circuit. In the matching box 64, a variable capacitor not shown in the drawing is provided.

The antenna 63 is connected to the matching box 64 via a lead wire. The lead wire consists of a material similar to that of the antenna 63. On the case 61, an insertion hole for inserting the lead wire is formed, and the antenna 63 in the antenna housing 61A and the matching box 64 outside the antenna housing 61A are connected via the lead wire inserted into the insertion hole. A sealing member is provided between the lead wire and the insertion hole to maintain airtightness between the inside and outside of the antenna housing 61A.

Between the antenna 63 and the rotary drum 4, a grid 66 may be provided as an ion-annihilating means. The grid 66 is for annihilating a part of ions and a part of electrons generated by the antenna 63. The grid 66 is a hollow member consisting of an electric conductor, and is grounded. In order to flow a cooling medium (for example, cooling water) inside the grid 66 consisting of a hollow member, a hose for supplying a cooling medium is connected to the end of the grid 66.

Further, the reactive gas supply means 70 is disposed in the plasma treatment region 60A and around it. The reactive gas supply means 70 of this embodiment comprises the reactive gas cylinder 71 for storing a reactive gas (for example, oxygen gas, nitrogen gas, fluorine gas, ozone gas, etc.), the massflow controller 72 for controlling flow rate of the reactive gas supplied from the reactive gas cylinder 71, and the piping 75a for introducing the reactive gas into the plasma treatment region 60A.

When the rotary drum 4 is rotated by the motor 40 (refer to FIG. 4), the substrate 101 held on the outer surface of the rotary drum 4 revolves and repeatedly moves from a position facing the sputtering region 80A to a position facing the plasma treatment region 60A, or vice versa. As a result of such revolution of the substrate 101 as described above, the substrate 101 is successively and repeatedly subjected to a sputtering treatment in the sputtering region 80A and a plasma treatment in the plasma treatment region 60A, and a thin film (first film 103) is thereby coated on the surface of the substrate 101. In particular, when electric power is supplied to the antenna 63 from the radio frequency power supply 65 in a state that the reactive gas is introduced into the plasma treatment region 60A from the reactive gas cylinder 71 via the piping 75a, plasma is generated in a region facing the antenna 63 in the plasma treatment region 60A, and the first film deposition material deposited on the surface of the substrate 101 is densified to form a thin film (first film 103) having sufficient characteristics.

<<Vapor Deposition Region, Vapor Deposition Source and Ion Gun>>

Returning back to FIG. 3, the vapor deposition region 30A is provided at a lower part of the vacuum vessel 2 in the vertical direction (x-direction). The vapor deposition region 30A is a region for coating the oil-repellent film 105 by vapor deposition on the surface of the first film 103 coated on the surface of the substrate 101.

Below the vapor deposition region 30A (on the internal bottom wall of the vacuum vessel 2), a vapor deposition source 36 of resistance heating type is provided. Since the configuration of the vapor deposition source 36 is the same as that of the second embodiment, explanation thereof is omitted.

A piping 23 for evacuation is connected to the internal bottom wall of the vacuum vessel 2, and a vacuum pump 24 for evacuating a space around the deposition source 36 is connected to the piping 23. The degree of vacuum in the vacuum vessel 2 can be controlled by the vacuum pump 24 and a controller (not shown in the drawing).

A door 3 is provided on the side of the vacuum vessel 2 (z-direction), and the door 3 is opened and closed by sliding or rotating it. A load lock chamber may be separately connected outside the door 3.

According to this embodiment, the ion gun 38 is further disposed at a lower part of the vacuum vessel 2 in the vertical direction (x-direction). Since the configuration of the ion gun 38 is the same as that of the second embodiment, explanation thereof is omitted.

<<Method for Depositing Film>>

Hereafter, an example of the method for depositing a film using the film deposition system 1a will be explained.

In this embodiment, a case where metallic silicon (Si) as the first film deposition material is used as the targets 82a and 82b, and the second film deposition material as a material for coating the oil-repellent film is charged in the boat of the evaporation source 36 is exemplified. Further, a case where nitrogen gas is used as the reactive gas is exemplified.

In this embodiment, there is exemplified a case where the first irradiation treatment (preoperative irradiation) is performed for the substrate 101 with an ion beam generated by an ion gun, then the first film 103 is deposited by the sputtering method, and the oil-repellent film 105 is further deposited by the vacuum vapor deposition method of resistance heating type.

In the film deposition of the first film 103 by the sputtering method, for example, an intermediate thin film is coated by a sputtering step for adhering a thin film having a thickness considerably smaller than the objective thickness to the surface of the substrate 101 and a reaction step for performing a nitridation treatment of the thin film to convert the composition of the thin film, and these sputtering step and reaction step are repeated a plurality of times to laminate a plurality of the intermediate thin layers to coat the first film 103 as a final thin film having the objective thickness on the surface of the substrate 101. Specifically, by repeating a step of coating an intermediate thin film having an average thickness of about 0.01 to 1.5 nm determined after conversion of the composition on the surface of the substrate 101 through the sputtering step and the reaction step, the first film 103 as the final thin film having an objective thickness of about several to several hundreds of nanometers is coated.

(1) First, the substrate 101 is set on the rotary drum 4 outside the vacuum vessel 2, and accommodated in the load lock chamber of the vacuum vessel 2. The substrate 101 is preferably subjected to wet cleaning before or after the setting.

Then, the rotary drum 4 is moved to the inside of the vacuum vessel 2 along a rail. At the same time, the targets 82a and 82b in the sputtering region 80A are held by the sputtering electrodes 81a and 81b, respectively. Then, the inside of the vacuum vessel 2 is sealed, and the inside of the vacuum vessel 2 is decompressed to a predetermined pressure by using the vacuum pump 15a.

(2) Then, by driving the motor 40 provided behind the vacuum vessel 2, rotation of the rotary drum 4 is started. The revolving speed (RS) of the rotary drum 4 is selected to be, for example, 25 rpm or higher, preferably 30 rpm or higher, more preferably 50 rpm or higher. If the value of RS is made unduly small, there arises a tendency that the sputtering time for one sheet of the substrate 101 becomes longer, as a result, the thickness of the thin film coated on the substrate 101 becomes thicker, and thus the plasma treatment in the plasma treatment region 60A cannot be sufficiently performed. On the other hand, if the value of RS is made unduly large, the sputtering time for one sheet of the substrate 101 becomes shorter, the number of particles deposited on each substrate 101 decreases to make the thickness of the thin film unduly thin, and thus production efficiency may be affected. For this reason, the value of RS is preferably 250 rpm, more preferably 200 rpm, still more preferably 100 rpm, at most.

Figure 8:
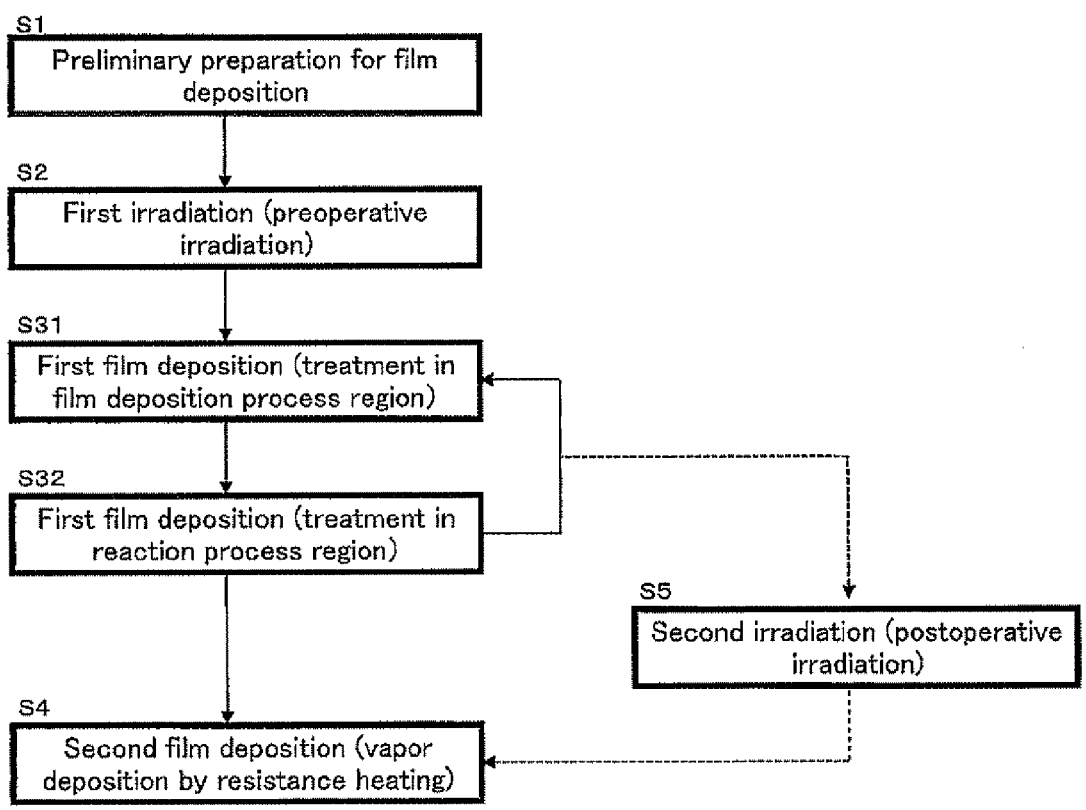
FIG. 8 is a flowchart showing flow of a film deposition method using the film deposition system shown in FIGS. 3 to 6.

The above is the preliminary preparation for the film deposition in S1 mentioned in FIG. 8.

(3) Then, in S2 mentioned in FIG. 8, the irradiation electric power for the ion gun 38 is increased from that of the idling state to a predetermined irradiation electric power, and the shutter 38a is opened to irradiate an ion beam on the surface of the substrate 101 under rotation. This step is an example of the first irradiation treatment (preoperative irradiation). This embodiment is also characterized in that the preoperative irradiation is performed for the surface of the substrate 101 in advance of the deposition of the first film 103. The preoperative irradiation can be performed with the same conditions as those explained for the second embodiment.

(4) Then, the irradiation electric power for the ion gun 38 is returned to the level of the idling state, and the shutter 38a is closed. Along with this, in 831 mentioned in FIG. 8, argon gas is introduced into the sputtering region 80A from the sputtering gas feeding means 90, and in this state, electric power is supplied to the sputtering electrodes 81a and 81b from the AC power supply 84 to carry out the sputtering of the targets 82a and 82b. Flow rate of the argon gas is appropriately set to be in the range of about 250 to 1000 sccm. In this state, the rotary drum 4 is rotated to transfer the substrate 101 subjected to the preoperative irradiation to the sputtering region 80A, and coat deposit (microfilm) of metallic silicon (Si) on the surface of the substrate 101. For this deposition, heating of the substrate 101 is not required (room temperature). However, the substrate 101 may be heated to a temperature as low as, for example, about 220° C. or lower, preferably 150° C. or lower, more preferably 100° C. or lower, still more preferably 80° C. or lower, and preferably about 50° C. or higher.

(5) Then, in S32 mentioned in FIG. 8, an alternating voltage is applied to the antenna 63 from the radio frequency power supply 65 in a state that nitrogen gas is introduced into the inside of the plasma treatment region 60A from the reactive gas supply means 70 to generate plasma of nitrogen gas in the plasma treatment region 60A. In this state, the rotary drum 4 is rotated to transfer the substrate 101 subjected to the preoperative irradiation to the plasma treatment region 60A. Inside the plasma treatment region 60A, plasma of nitrogen gas is generated, and therefore 3 moles of metallic silicon Si adhering to the surface of the substrate 101 reacts with 2 moles of nitrogen gas to form 1 mole of silicon nitride ($Si_3N_4$), which constitutes the intermediate thin film. In addition, heating of the substrate 101 is not particularly required also in this step (room temperature). Time of this step is appropriately chosen to be within the range of, for example, about 1 to 60 minutes. Flow rate of the nitrogen gas is also appropriately chosen to be about 70 to 500 sccm, and the electric power supplied from the radio frequency power supply 65 is also appropriately determined to be within the range of about 1.0 to 5.0 kW. Pressure of the nitrogen gas introduced into the plasma treatment region 60A (film deposition pressure) is preferably about 0.3 to 0.6 Pa. The flow rate of the nitrogen gas can be controlled with the massflow controller 72, and the electric power supplied from the radio frequency power supply 65 can be controlled with the matching box 64.

In this embodiment, the rotary drum 4 is continuously rotated to successively repeat the sputtering treatment and the plasma treatment to laminate a plurality of intermediate thin films and thereby coat the first film 103 that consists of an $Si_3N_4$ thin film having a desired thickness on the surface of the substrate 101 subjected to the preoperative irradiation (first film deposition process, refer to S31 and S32 mentioned in FIG. 8).

(6) Then, the operations in the sputtering region 80A and the plasma treatment region 60A are terminated, and the shutter 36a is opened to start the operation in the vapor deposition region 30A. Specifically, the second film deposition material as a material for coating the oil-repellent film charged in the crucible (boat) 36b is heated. And the inside of the vacuum vessel 2 is sealed, and the inside of the vacuum vessel 2 is decompressed to a predetermined pressure using the vacuum pump 15a.

(7) Then, in S4 mentioned in FIG. 8, as in the case of (2) mentioned above, by driving the motor 40 provided behind the vacuum vessel 2, rotation of the rotary drum 4 is started. The rotary drum 4 is rotated at a revolving speed (RS) similar to that used in (2) mentioned above.

If the shutter 36a is opened, the heated second film deposition material diffuses into the vapor deposition region 30A, and a part of it adheres to the surface of the first film 103 deposited on the surface of the substrate 101 held by the rotary drum 4 under rotation, so that deposition of a film having a predetermined thickness is attained (second film deposition process, refer to S4 mentioned in FIG. 8). In this embodiment, film deposition rate of the second film deposition material is, for example, 0.1 nm/second or higher, preferably 0.2 to 0.4 nm/second. As a result, the oil-repellent film 105 is deposited with a predetermined thickness on the first film 103. By performing the steps described above, the oil-repellent substrate 100 shown in FIG. 1 is produced.

The method for depositing a film using the film deposition system 1a according to this embodiment also exhibits the same effects as those obtained by the second embodiment.

In this embodiment, an example of coating only the $Si_3N_4$ thin film as the first film 103 on the substrate 101 is explained. However, together with this $Si_3N_4$ thin film, another thin film such as $SiO_2$ thin film and $Al_2O_3$ thin film can also be laminated. In such a case, what is necessary is to appropriately change materials of the targets 82a and 82b of the sputtering means 80 disposed in the sputtering region 80A. Further, as the first film 103 coated on the substrate 101, a thin film other than $Si_3N_4$ thin film, for example, an $SiO_2$ thin film or $Al_2O_3$ thin film may be coated instead of the $Si_3N_4$ thin film. In such a case, what is necessary is to appropriately change the materials of the targets 82a and 82b to any of various metals such as Al, Zr and Cr, or a plurality of kinds of metals, or to change type of the reactive gas to, for example, oxygen gas, fluorine gas, ozone gas, or the like.

Further, in the embodiment described above, a second irradiation treatment (postoperative irradiation) similar to that of the second embodiment can also be performed for the surface of the first film 103 in advance of the second film deposition process (refer to S5 mentioned in FIG. 8).

In addition, in the explained example of this embodiment, the ion gun 38 is disposed at a lower part of the vacuum vessel 2 in the vertical direction. However, disposition of the ion gun 38 is not essential. If the ion gun 38 is not disposed, it is preferable to dispose a mechanism for positively applying a bias voltage to the rotary drum 4 as a substrate holding mechanism. If a bias voltage is applied to the rotary drum 4, directivity is imparted to the ions in the thermal plasma generated by the plasma generation means 60 by the bias voltage. If such ions imparted with directivity collide with the surface of the substrate 101 under rotation with appropriate conditions, appropriate concaves are formed on the surface of the substrate 101, and along with this, appropriate concaves are also formed on the surface of the first film 103 deposited on the surface of the substrate 101.

EXAMPLES

Hereafter, the present invention will be explained in detail with reference to examples, which more specifically embodies the aforementioned embodiments of the present invention.

Example 1

In this example, a film deposition system having the configuration of the film deposition system 1 shown in FIG. 2 for performing ion beam-assisted vapor deposition was prepared, and oil-repellent substrate samples were obtained by film deposition performed under the conditions shown in Table 1.

As the substrate 101, a glass substrate having a pencil hardness of 6H was used. The "hardness" used here is a value of the pencil hardness measured by the method defined in JIS-K5600-5-4.

The substrate 101 was subjected to wet cleaning before the first irradiation treatment. $SiO_2$ was used as the first film deposition material. Substrate temperature at the time of the first film deposition process was 150° C.

Operation conditions of the neutralizer except for Experimental Example 2 were as follows: accelerating voltage: 30 to 70 V, electronic current: 1 A, type of introduced gas: ($O_2$+Ar), and introduced volume of gas: 50 sccm. The values of hardness of the $SiO_2$ thin films are values of pencil hardness measured by the method described above.

The values of the "center line average height (Ra)", "10-point average height (Rz)", and "maximum valley depth (Pv)" of the $SiO_2$ thin films are values measured by using a scanning type probe microscope of Seiko Instruments Inc., "SPI-3700", which is an atomic force microscope (AFM), in the dynamic force mode for a measurement area of 5 μm×5 μm (5-μm square) of the $SiO_2$ thin film surfaces.

As the second film deposition material, an oil repellent agent produced by Canon Optron, Inc. (trade name: OF-SR, component: fluorine-containing organosilicon compound) was used. Only for Experimental Examples 6 and 7, in advance of the film deposition with the second film deposition material (second film deposition process), the $SiO_2$ thin film (first film) surfaces were subjected to the second irradiation treatment (postoperative irradiation) using the ion gun 38 for a predetermined time (20 seconds) (number of irradiated ions: $3.7 \times 10^{15}$ particles/cm$^2$). Conditions of the postoperative irradiation were as follows: accelerating voltage: 1000 V, electric current: 30 μA/cm$^2$, introduced gas: argon (Ar), and volume of introduced gas: 40 sccm.

TABLE 1

(Example 1)

| | First irradiation (preoperative irradiation) | | | | | | First film deposition (ion-assisted deposition) | | | | | | |
|---|---|---|---|---|---|---|---|---|---|---|---|---|---|
| | | | | | | Number of | Ion assisting conditions | | | | | SiO$_2$ thin film | |
| Experimental Example | Accelerating voltage V 3 (V) | Current density I3 (μA/cm$^2$) | Introduced gas Type | Introduced volume (sccm) | Time T3 (second) | irradiated particle (particles/cm$^2$) | Accelerating voltage V 1 (V) | Current density I1 (μA/cm$^2$) | Introduced gas Type | Introduced volume (sccm) | Deposition rate (nm/second) | Thickness (nm) | Hardness |
| 1 | 1000 | 30 | Ar + O$_2$ | 20 + 30 | 600 | 1.1E+17 | 1000 | 30 | O$_2$ | 40 | 0.125 | 15 | 9H |
| 2 | 1000 | 30 | Ar + O$_2$ | 20 + 30 | 600 | 1.1E+17 | — | — | — | — | 0.25 | 15 | 6H |
| 3 | 1000 | 30 | Ar + O$_2$ | 20 + 30 | 600 | 1.1E+17 | — | — | — | — | — | — | — |
| 4 | 750 | 20 | Ar + O2 | 20 + 30 | 300 | 3.7E+16 | 1000 | 30 | O$_2$ | 40 | 0.125 | 15 | 9H |
| 5 | 500 | 30 | Ar + O2 | 20 + 30 | 900 | 1.7E+17 | 1000 | 30 | O$_2$ | 40 | 0.125 | 15 | 9H |
| 6 | — | — | — | — | — | — | 1000 | 30 | O$_2$ | 40 | 0.125 | 15 | 9H |
| 7 | 1000 | 30 | Ar + O$_2$ | 20 + 30 | 600 | 1.1E+17 | 1000 | 30 | O$_2$ | 40 | 0.125 | 15 | 9H |
| 8 | 1000 | 30 | Ar + O$_2$ | 20 + 30 | 300 | 5.5E+16 | 1000 | 30 | O$_2$ | 40 | 0.125 | 15 | 9H |

| | Second irradiation (postoperative irradiation) | | | | | | | | Second film deposition (vapor deposition by resistance heating) | | | Maximum number of times of reciprocating cycles in scratching test |
|---|---|---|---|---|---|---|---|---|---|---|---|---|---|
| | | | | | | Number of irradiated | SiO$_2$ thin film | | | | | | |
| Experimental Example | Accelerating voltage V 2 (V) | Current density I2 (μA/cm$^2$) | Introduced gas Type | Introduced volume (sccm) | Time T2 (second) | particles (particles/cm$^2$) | Ra (nm) | Rz (nm) | Pv (nm) | Material | Deposition rate (nm/minute) | Thickness (nm) | |
| 1 | — | — | — | — | — | — | 0.77 | 7.17 | 22.97 | OF—SR | 0.8 | 5 | 900 |
| 2 | — | — | — | — | — | — | 0.81 | 9.38 | 27.68 | OF—SR | 0.8 | 5 | 600 |
| 3 | — | — | — | — | — | — | 0.87 | 7.93 | 20.23 | OF—SR | 0.8 | 5 | 700 |
| 4 | — | — | — | — | — | — | 0.76 | 8.41 | 26.17 | OF—SR | 0.8 | 5 | 1300 |
| 5 | — | — | — | — | — | — | 0.63 | 7.18 | 20.29 | OF—SR | 0.8 | 5 | 800 |
| 6 | — | — | — | — | — | — | 0.66 | 4.99 | 11.03 | OF—SR | 0.8 | 5 | 300 |
| 7 | 1000 | 30 | Ar | 40 | 20 | 3.7E+15 | 0.86 | 21.26 | 83.09 | OF—SR | 0.8 | 5 | 2600 |
| 8 | 1000 | 30 | Ar | 40 | 20 | 3.7E+15 | 1.09 | 14.48 | 65.76 | OF—SR | 0.8 | 5 | 2200 |

Example 2

In this example, a film deposition system having the configuration of the film deposition system 1a shown in FIGS. 3 to 6 for performing magnetron sputtering was prepared, and oil-repellent substrate samples were obtained by film deposition performed under the conditions shown in Table 2.

As the substrate 101, a glass substrate having a pencil hardness of 6H was used. The "hardness" used here is a value of the pencil hardness measured by the method defined in JIS-K5600-5-4.

was used. Only for Experimental Examples 10 and 11, in advance of the film deposition with this second film deposition material (second film deposition process), the $Si_3N_4$ thin film (first film) surfaces were subjected to the second irradiation treatment (postoperative irradiation) using the ion gun 38 for a predetermined time (20 seconds) (number of irradiated ions: $3.7 \times 10^{15}$ particles/$cm^2$). Conditions of the postoperative irradiation were as follows: accelerating voltage: 1000 V, electric current: 30 μA/$cm^2$, introduced gas: argon (Ar), and volume of introduced gas: 40 sccm.

TABLE 2

(Example 2)

| Experimental Example | First irradiation (preoperative irradiation) | | | | | | First film deposition (sputtering treatment and reaction treatment) Sputtering region | | | |
|---|---|---|---|---|---|---|---|---|---|---|
| | Accelerating voltage V3 (V) | Current density I3 (μA/cm²) | Introduced gas Type | Introduced volume (sccm) | Time T3 (second) | Number of irradiated particles (particles/cm²) | Applied electric power (kW) | Introduced gas Type | Introduced volume (sccm) | Deposition rate (nm/second) |
| 9 | 1000 | 30 | Ar + O₂ | 20 + 30 | 800 | 1.1E+17 | 5 | Ar | 100 | 0.25 |
| 10 | — | — | — | — | — | — | 5 | Ar | 100 | 0.25 |
| 11 | 1000 | 30 | Ar + O₂ | 20 + 30 | 600 | 1.1E+17 | 5 | Ar | 100 | 0.25 |
| 12 | 1000 | 30 | Ar + O₂ | 20 + 30 | 300 | 6.6E+16 | 5 | Ar | 100 | 0.25 |

| Experimental Example | First film deposition (sputtering treatment and reaction treatment) Plasma treatment region | | | | Si₃N₄ thin film | | Second irradiation (postoperative irradiation) | | | | |
|---|---|---|---|---|---|---|---|---|---|---|---|
| | Applied electric power (kW) | AC voltage Frequency (MHz) | Introduced gas Type | Introduced volume (sccm) | Thickness (nm) | Hardness | Accelerating voltage V2 (V) | Current density I2 (μA/cm²) | Introduced gas Type | Introduced volume (sccm) | Time T2 (second) |
| 9 | 1 | 13.55 | N₂ | 100 | 10 | 9H | — | — | — | — | — |
| 10 | 1 | 13.55 | N₂ | 100 | 10 | 9H | — | — | — | — | — |
| 11 | 1 | 13.58 | N₂ | 100 | 10 | 9H | 1000 | 30 | Ar | 50 | 20 |
| 12 | 1 | 13.56 | N₂ | 100 | 10 | 9H | 1000 | 30 | Ar | 50 | 20 |

| Experimental Example | Second irradiation (postoperative irradiation) Number of irradiated particles (particles/cm²) | Si₃N₄ thin film | | | Second film deposition (vapor deposition by resistance heating) | | | Maximum number of times of reciprocating cycles in scratching test |
|---|---|---|---|---|---|---|---|---|
| | | Ra (nm) | Rz (nm) | Pv (nm) | Material | Deposition rate (nm/minute) | Thickness (nm) | |
| 9 | — | 1.53 | 8.01 | 18.11 | OF—SR | 0.8 | 5 | 800 |
| 10 | — | 1.03 | 5.88 | 12.18 | OF—SR | 0.8 | 5 | 300 |
| 11 | 3.75E+15 | 0.94 | 25.89 | 78.91 | OF—SR | 0.8 | 5 | 2800 |
| 12 | 3.75E+15 | 1.22 | 27.93 | 83.46 | OF—SR | 0.8 | 5 | 3100 |

The substrate 101 was subjected to wet cleaning before the first irradiation treatment. As the targets 82a and 82b, tabular metallic silicon (Si) targets were used.

Revolving speed (RS) of the rotary drum 4 was 100 rpm. Substrate temperature at the time of the first film deposition process was 100° C. The values of hardness of $Si_3N_4$ thin films are values of pencil hardness measured by the aforementioned method. The values of Ra, Rz and Pv of the $Si_3N_4$ thin films are values measured by using SPI-3700 similar to that used in Example 1 under the same conditions.

As the second film deposition material, an oil repellent agent produced by Canon Optron, Inc. (trade name: OF-SR, component: fluorine-containing organosilicon compound)

<<Evaluation>>

A scratching test was performed by placing steel wool #0000 of 1 $cm^2$ on the surface of the oil-repellent film 105 of each of the obtained oil-repellent substrate samples, and reciprocally moving the steel wool along a straight line of 50 mm at a speed of 1 second for one reciprocating cycle with a load of 1 kg/$cm^2$. After every 500 times of the reciprocating cycles of the scratching test, lines were drawn on the test surface (surface of the oil-repellent film 105) with an oily marker (organic solvent type marker, trade name: Mckee Extra Fine, Zebra Co., Ltd.), and it was evaluated whether the organic solvent type ink of the organic solvent type marker could be wiped off with dry cloth. As a result, the maximum numbers of times of the reciprocating cycles allowing wiping off of the organic solvent type ink were as shown in Tables 1 and 2 mentioned above.

<<Discussion>>

From the results shown in Table 1, superior usefulness of the samples of Experimental Examples 1, 2, 7 and 8 could be confirmed compared with the sample of Experimental Example 5. In particular, it could be confirmed that the maximum number of times of the reciprocating cycles in the scratching test was markedly increased by subjecting $SiO_2$ thin film surfaces to the second irradiation treatment (postoperative irradiation) for a predetermined time in advance of the second film deposition process (vapor deposition by resistance heating) (Experimental Examples 7 and 8) compared with the case where the second irradiation treatment was not performed (Experimental Examples 1 and 2). In addition, it could be confirmed that, when the time of the preoperative irradiation was shortened from 10 minutes to 5 minutes, the maximum number of times of the reciprocating cycles in the scratching test was decreased to 2200 (Experimental Example 8), but sufficient maximum number of times of the reciprocating cycles in the scratching test could be still obtained even in this case. It could also be confirmed that even if the conditions of the first irradiation (preoperative irradiation) were changed, evaluation results substantially the same as those of Experimental Examples 1 and 2 could be obtained (Experimental Examples 4 and 5). Further, it could be confirmed that the maximum number of times of the reciprocating cycles in the scratching test was decreased to 700 when the oil-repellent film 105 was deposited on the surface of the substrate 101 subjected to the first irradiation without depositing $SiO_2$ thin film (Experimental Example 3) in contrast to the case where an $SiO_2$ thin film was deposited (Experimental Example 1), but sufficient maximum number of times of the reciprocating cycles in the scratching test could be still obtained even in such a case compared with the result of Experimental Example 6 (300 times).

From the results shown in Table 2, superior usefulness of the sample of Experimental Example 9 could be confirmed compared with the sample of Experimental Example 10. It could also be confirmed that even when the conditions of the first irradiation (preoperative irradiation) were changed, evaluation results similar to that of Experimental Example 9 could be obtained (Experimental Examples 11 and 12).

The reason why the organic solvent type ink of the oily marker could be wiped off with dry cloth even after the number of times of the reciprocating cycles in the scratching test exceeded 500 for the samples of Experimental Examples 1 to 5, 7 to 9, 11 and 12 as shown in Tables 1 and 2 is not necessarily clear. However, it is estimated as follows. That is, it is considered that appropriate convexes and concaves are imparted to the surface of the substrate 101 by the preoperative irradiation for the surface of the substrate 101, and these convexes and concaves are transferred and imparted to the surface of the first film 103 ($SiO_2$ thin film or $Si_3N_4$ thin film) deposited on the surface of the substrate 101 subjected to the preoperative irradiation. Thus, it is considered that, among the convexes and concaves imparted to the first film 103, the convexes secured abrasion resistance, the concaves held the components of the oil-repellent film 105 therein to secure oil repellency of the sample surfaces, and thereby abrasion resistance of practically sufficient level was imparted.

Figure 9:
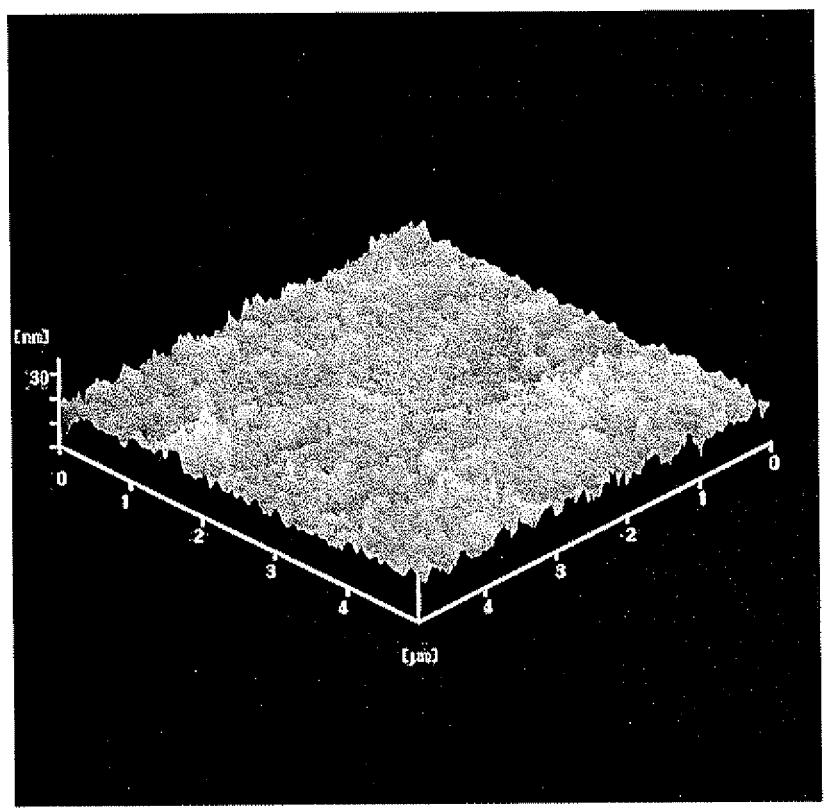
FIG. 9 is an AMF image (photograph) of a surface layer of the oil-repellent film formed in Example 1, Experimental Example 7.
Figure 10:
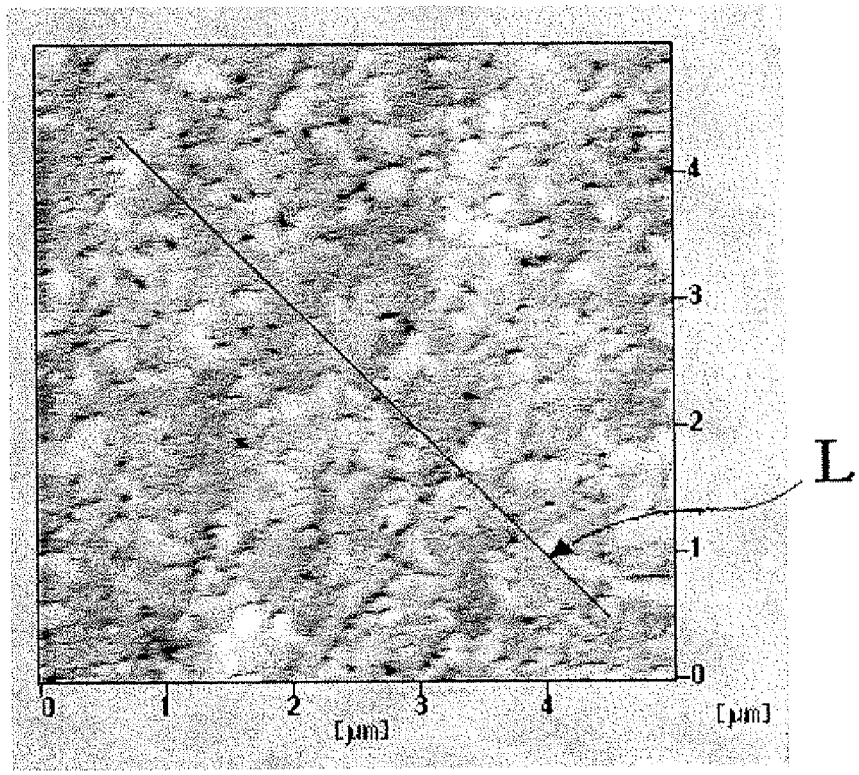
FIG. 10 is a two-dimensional AMF image (photograph) of the surface layer of the oil-repellent film 105 formed in Experimental Example 7.
Figure 11:
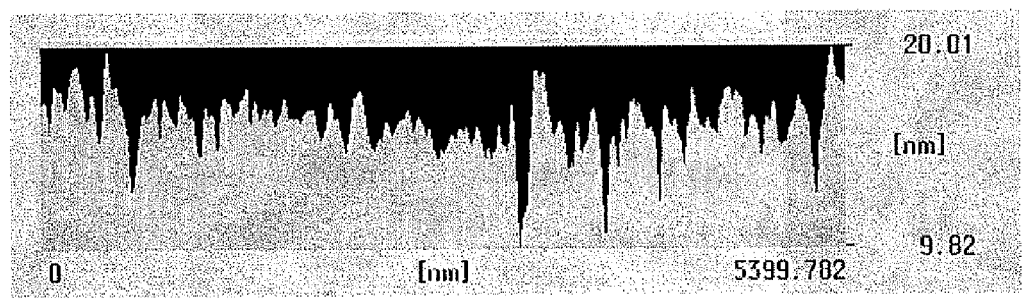
FIG. 11 is a sectional view along the line L drawn in FIG. 10.

For reference, an AMF image (photograph) of a surface layer of the oil-repellent film 105 (5-μm square) coated in Experimental Example 7 of Example 1 is shown as FIG. 9. In FIG. 9, the maximum lengths in the X and Y-directions correspond to 5 μm, and the maximum length in the Z-direction corresponds to 30 nm. A two-dimensional AMF image (photograph) of the surface layer of the oil-repellent film 105 (5-μm square) coated in Experimental Example 7 is shown as FIG. 10, and a sectional analysis diagram along the line L drawn in FIG. 10 is shown as FIG. 11.

As for the surface of the oil-repellent film 105 of Experimental Example 7 of Example 1, Ra was 1.61 nm, Rz was 16.29 nm, and Pv was 36.26 nm. In this Experimental Example 7, before the oil-repellent film 105 was deposited, the $SiO_2$ thin film showed Ra of 0.86 nm, Rz of 21.26 nm, and Pv of 83.9 nm (refer to Table 1). Therefore, it is considered that the deposition of the oil-repellent film 105 on the surface of the $SiO_2$ thin film provided adhesion of the components constituting the oil-repellent film 105 to the concaves formed on the $SiO_2$ thin film surface, and the surface of the oil-repellent film 105 was thereby flattened compared with the surface condition of the $SiO_2$ thin film.

The invention claimed is:

1. A method for preparing an abrasion resistance oil-repellant film on a substrate comprising:
   irradiating an ion beam as a first irradiation roughening step on a surface of a substrate to form predetermined surface roughness on the surface of the substrate so that the surface roughness of a center line average height (Ra): 0.1-1000 nm, a 10-point average height (Rz): 5-2000 nm and a maximum valley depth (Pv): 15-2000 nm is transferred to a surface of a first film to be deposited on the substrate and
   depositing the first film on the surface of the substrate by a dry ion-assisted deposition method wherein the ion beam is continually irradiated between the roughening step and this depositing step; and
   depositing a second film having oil repellency on the roughened surface by vacuum vapor deposition to form the abrasion resistance oil-repellent film on the substrate.

2. The method for depositing a film according to claim 1, wherein particles having energy of accelerating voltage at 100 to 2000 V are used in the first irradiation step.

3. The method for depositing a film according to claim 1, wherein particles having energy of current density at 1 to 120 μA/cm$^2$ are used in the first irradiation step.

4. The method for depositing a film according to claim 3, wherein the current density is 30 μA/cm$^2$.

5. The method for depositing a film according to claim 1, wherein particles are irradiated in a number of $5 \times 10^{14}$ to $5 \times 10^{17}$ particles/cm$^2$ in the first irradiation step.

6. The method for depositing a film according to claim 1, wherein particles as the ion beam contains at least argon or oxygen.

7. The method for depositing a film according to claim 1, wherein:
   a second irradiation step of irradiating particles having energy on the first film is performed in advance of the second film deposition step.

8. The method for depositing a film according to claim 7, wherein:
   particles having energy of accelerating voltage at 100 to 2000 V are used in the second irradiation step.

9. The method for depositing a film according to claim 7, wherein:
   particles having energy of current density at 1 to 120 μA/cm$^2$ are used in the second irradiation step.

10. The method for depositing a film according to claim 7, wherein:
    the particle are irradiated for 1 to 800 seconds in the second irradiation step.

11. The method for depositing a film according to claim 7, wherein:
the particle are irradiated in a number of $1 \times 10^{13}$ to $5 \times 10^{17}$ particles/cm$^2$ in the second irradiation step.

12. The method for depositing a film according to claim 7, wherein:
the particles having energy used in the second irradiation step are an ion beam containing at least argon.

13. The method for depositing a film according to claim 1 wherein Pv is 30-150 nm.

14. The method for depositing a film according to claim 1 wherein the surface roughness of the first film comprises adjacent convexes and the distance λ between adjacent convexes formed on the surface of the first film is 1-50 nm.

15. The method for depositing a film according to claim 1 wherein the second film has a thickness of 0.1-15 nm.

16. The method for depositing a film according to claim 1 wherein the first film has a pencil hardness greater than 9H.

17. The method for depositing a film according to claim 1, wherein the substrate is a glass substrate, the first film deposited is silicon dioxide and the second film deposited is a fluorine containing organosilicon compound.

18. The method for depositing a film according to claim 17, wherein the glass substrate has a pencil hardness of 6 H.

19. The method for depositing a film according to claim 1, wherein particles having energy of current density at 30 μA/cm$^2$ are used for the first irradiation step by an irradiated ion beam formed from a mixture of oxygen and argon gas.

20. The method for depositing a film accord to claim 1, wherein the substrate is a glass substrate which has a pencil hardness of 6 H;
the first film deposited is silicon dioxide and the second film deposited by vapor deposition and is a fluorine containing organosilicon compound;
particles having energy of current density at 30 μA/cm$^2$ are used for the first irradiation step by an irradiated ion beam formed from a mixture of oxygen and argon gas;
particles having energy of current density at 30 μA/cm$^2$ are used for a second irradiation step which takes place in the presence of argon gas.

* * * * *